(12) United States Patent
Isobayashi et al.

(10) Patent No.: US 8,168,528 B2
(45) Date of Patent: May 1, 2012

(54) RESTORATION METHOD USING METAL FOR BETTER CD CONTROLLABILITY AND CU FILING

(75) Inventors: Atsunobu Isobayashi, Clifton Park, NY (US); Yoshihiro Uozumi, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/486,901

(22) Filed: Jun. 18, 2009

(65) Prior Publication Data

US 2010/0323514 A1 Dec. 23, 2010

(51) Int. Cl.
*H01L 21/768* (2006.01)

(52) U.S. Cl. .. 438/618; 438/637; 438/687; 257/E21.585

(58) Field of Classification Search .......... 438/618, 438/622, 637–639, 641–642, 687
See application file for complete search history.

(56) References Cited

U.S. PATENT DOCUMENTS

| | | | |
|---|---|---|---|
| 7,037,836 B2 * | 5/2006 | Lee | 438/687 |
| 7,304,384 B2 | 12/2007 | Kaike et al. | |
| 7,332,426 B2 * | 2/2008 | Ikeda et al. | 438/618 |
| 7,410,666 B2 * | 8/2008 | Elers et al. | 427/97.7 |
| 7,494,927 B2 * | 2/2009 | Kostamo et al. | 438/685 |
| 7,507,659 B2 * | 3/2009 | Ohtsuka et al. | 438/643 |
| 7,888,253 B2 * | 2/2011 | Usui et al. | 438/597 |
| 2005/0215053 A1 * | 9/2005 | Soininen et al. | 438/658 |
| 2006/0113674 A1 * | 6/2006 | Toyoda et al. | 257/762 |
| 2007/0001307 A1 * | 1/2007 | Usui et al. | 257/758 |
| 2007/0012973 A1 * | 1/2007 | Nasu et al. | 257/295 |
| 2007/0173055 A1 * | 7/2007 | Ohtsuka et al. | 438/627 |
| 2008/0179747 A1 * | 7/2008 | Sakai et al. | 257/751 |
| 2008/0290517 A1 * | 11/2008 | Kageyama | 257/751 |
| 2009/0087981 A1 * | 4/2009 | Suzuki et al. | 438/643 |
| 2009/0239369 A1 * | 9/2009 | Kim et al. | 438/598 |
| 2010/0052028 A1 * | 3/2010 | Hayashi et al. | 257/306 |
| 2010/0081274 A1 * | 4/2010 | Ishizaka et al. | 438/653 |
| 2010/0099254 A1 * | 4/2010 | Narushima et al. | 438/668 |
| 2010/0105154 A1 * | 4/2010 | Wang et al. | 438/15 |
| 2010/0112806 A1 * | 5/2010 | Matsumoto et al. | 438/643 |
| 2010/0140802 A1 * | 6/2010 | Matsumoto et al. | 257/741 |
| 2010/0233876 A1 * | 9/2010 | Matsumoto et al. | 438/652 |
| 2010/0320604 A1 * | 12/2010 | Isobayashi | 257/751 |

OTHER PUBLICATIONS

Haneda, et al.; Self-Restored Barrier using Cu-Mn alloy, Proc. of Advanced Metallization Conf (AMC 2007), pp. 59-65.

\* cited by examiner

*Primary Examiner* — Savitr Mulpuri
(74) *Attorney, Agent, or Firm* — Turocy & Watson, LLP

(57) ABSTRACT

Methods of making interconnect structures are provided. In one aspect of the innovation, when forming a trench or via in a dielectric layer, the sidewall surface of another via and/or trench is covered with a metal oxide layer. The metal oxide layer can prevent and/or mitigate surface erosion of the sidewall surface. As a result, the methods can improve the controllability of critical dimensions of the via and trench.

27 Claims, 18 Drawing Sheets

RESTORATION METHOD USING METAL FOR BETTER CD CONTROLLABILITY AND CU FILING

TECHNICAL FIELD

The following description relates generally to methods of making interconnect structures for semiconductor devices.

BACKGROUND

Semiconductor processing involves a number of different chemical and physical steps whereby minute electronic devices are created on a substrate at the front end of a fabrication process. Integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and followed by wet and dry etching techniques.

Patterns are created within layers by the implantation of dopants at particular locations. The substrate upon which the devices are created may be silicon, gallium arsenide, glass, or other appropriate material.

In the production of integrated circuits upon the substrate, production of interconnect structures involves connecting the fabricated semiconductor devices on the chip with electrically conductive materials. The interconnect structure completes the circuits as designed to function within the total integrated circuit device. Metal lines are used in the metallization process as electrical connections between semiconductor devices.

Increased semiconductor device performance can be achieved, at least in part, through the further miniaturization of features such as transistors. Decreased feature sizes and decreased spacings between features allow more features to be placed in a unit area for greater device performance. As feature densities increase, the widths of the conductive lines and the spacings between the conductive lines also need to scale smaller.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

One aspect of the innovation provides a method of making an interconnect structure. The method involves providing a first cap layer and a dielectric layer over the first cap layer, the first dielectric layer containing a first via therein; forming a first metal oxide layer over the sidewall surface of the first via; and forming a first trench or a second via in the first dielectric layer. When forming the first trench or second via in the dielectric layer, the sidewall surface of the first via is covered with the first metal oxide layer. The first metal oxide layer can prevent and/or mitigate surface erosion of the sidewall surface of the first via. As a result, the method can improve the controllability of critical dimensions of the via.

In another aspect of the innovation of method of making an interconnect structure, a first metal oxide layer is formed over the sidewall surface of a first via and then a second via is formed in the dielectric layer. The method further involves forming a second metal oxide layer over the sidewall surface of the second via and forming a first trench in the dielectric layer adjacent to the first via and a second trench in the dielectric layer adjacent to the second via. When forming the first and second trenches in the dielectric layer, the sidewall surfaces of the first and second via are covered with the first and/or second metal oxide layers. The metal oxide layers can prevent and/or mitigate surface erosion of the sidewall surface of the first and second vias. As a result, the method can improve the controllability of critical dimensions of the vias.

In yet another aspect of the innovation of method of making an interconnect structure, a first metal oxide layer is formed over a sidewall surface of the first via and then a second via is formed in the dielectric layer. The method further involves forming a second metal oxide layer over the sidewall surface of the second via; forming a first trench in the dielectric layer adjacent to the first via; and forming a third metal oxide layer over the sidewall surface and bottom surface of the first trench; and forming a second trench in the dielectric layer adjacent to the second via.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

DETAILED DESCRIPTION

Figure 1:
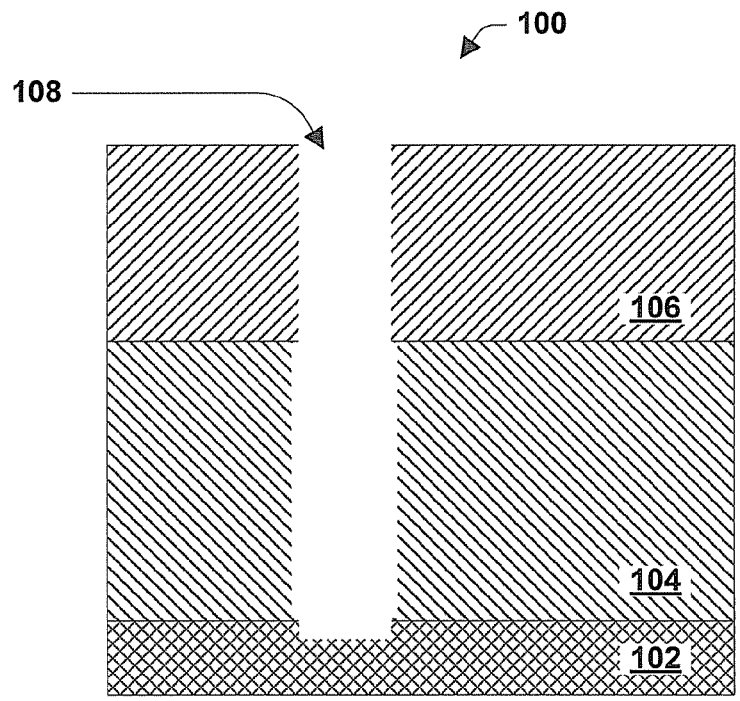
FIGS. 1 to 8 illustrate an exemplary methodology of forming an interconnect structure in accordance with an aspect of the subject innovation.

The subject innovation described herein provides methods of making an interconnect structure for semiconductor devices. The interconnect structure described herein can be used as a front end of the line (FEOL), a middle end of the line (MOL), and a back end of the line (BEOL). In the subject innovation, a sidewall surface and/or bottom surface of a via and/or a trench can be covered with a metal oxide layer while conducting an etching process.

Since the inner surface of the via or trench is protected by the metal oxide layer, the subsequent etching process does not substantially cause damage to the inner surface, for example, does not cause erosion of the inner surface of the via or trench. As a result, the subject innovation can improve the controllability of critical dimensions. The subject innovation can also prevent and/or mitigate void formation when forming a conductive feature in the via or trench.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Referring to FIGS. 1 to 26, some of many possible exemplary embodiments of forming an interconnect structure for a semiconductor device are specifically illustrated. FIG. 1 illustrates a cross sectional view of an intermediate state of an exemplary interconnect structure 100. The interconnect structure can contain a first cap layer 102, a first dielectric layer 104 over the first cap layer, and a second dielectric layer 106 over the first dielectric layer. The interconnect structure contains a first via 108 extending through the first and second dielectric layers.

The first cap layer 102 can contain any suitable dielectric capping material. Examples of dielectric capping materials include silicon carbide (SiC), silicon nitride (SiN), silicon carbon nitride (SiCN), tetrasilicon ammonia ($Si_4NH_3$), silicon oxide ($SiO_2$), a carbon doped oxide, a nitrogen and hydrogen doped silicon carbide SiC(N,H) or multiple layers thereof. The first cap layer has a thickness of about 10 nm or more and about 50 nm or less.

The first dielectric layer 104 can contain any suitable interlevel or intralevel dielectric including inorganic dielectrics or organic dielectrics. The dielectric material can be porous or non-porous. The first dielectric layer contains one or more dielectric layers. When the first dielectric layer contains two or more dielectric layers, the layers can be the same or different from each other. Examples of dielectric materials include silicon containing materials such as FSG (fluorinated silicon oxide (SiOF)), SiCOH (e.g., a carbon doped oxide material including elements of Si, C, H and O), HSQ (hydrogen silsesquioxane polymer), MSQ (methyl silsesquioxane polymer), OSG (organosilicate glass), and highly porous $SiO_2$, or organics such as parylene, BCB, polyphenylene oligomer, fluorocarbons, and combinations thereof.

The first dielectric layer 104 can have any suitable thickness that depends on the desired implementations of the interconnect structure. In one embodiment, the first dielectric layer has a thickness of about 50 nm or more and about 1,000 nm or less. In another embodiment, the first dielectric layer has a thickness of about 100 nm or more and about 800 nm or less. In yet another embodiment, the first dielectric layer has a thickness of about 200 nm or more and about 500 nm or less.

The first dielectric layer 104 can have a low dielectric constant ("low-k"). The first dielectric layer has a dielectric constant less than that of $SiO_2$. In one embodiment, the first dielectric layer has a dielectric constant less than about 3.0. In another embodiment, the first dielectric layer has a dielectric constant less than about 2.6. In yet another embodiment, the first dielectric layer has a dielectric constant less than about 2.3.

The second dielectric layer 106 can contain any suitable interlevel or intralevel dielectric including inorganic dielectrics or organic dielectrics. The dielectric material can be porous or non-porous. The second dielectric layer can contain one or more dielectric layers. When the second dielectric layer contains two or more dielectric layers, the layers can be the same or different from each other.

The second dielectric layer 106 can contain different dielectric material from the first dielectric layer 104. For example, the second dielectric layer contains silicon oxides and the first dielectric layer contains porous SiCOH. In one embodiment, the second dielectric layer contains one layer containing silicon oxides. In another embodiment, the second dielectric layer contains two or more layers; one layer contains silicon oxides and another layer contains SiCOH. For example, the second dielectric layer contains a $SiO_2$/SiCOH bilayer.

In another embodiment, the second dielectric layer contains the same material as the first dielectric layer. For example, the first and second dielectric layers contain SiCOH.

The second dielectric layer 106 can have any suitable dielectric constant that is the same or different from that of the first dielectric layer. The second dielectric layer can have a higher dielectric constant than that of the first dielectric layer. In one embodiment, the second dielectric layer has a dielectric constant more than about 2.6. In another embodiment, the second dielectric layer has a dielectric constant more than about 3.0. In yet another embodiment, the second dielectric layer has a dielectric constant more than about 3.3.

The second dielectric layer 106 can have any suitable thickness that depends on the desired implementations of the interconnect structure. In one embodiment, the second dielectric layer has a thickness of about 20 nm or more and about 500 nm or less. In another embodiment, the second dielectric layer has a thickness of about 30 nm or more and about 400 nm or less. In yet another embodiment, the second dielectric layer has a thickness of about 40 nm or more and about 300 nm or less.

The first via 108 extends through the first and second dielectric layers. A portion of upper surface of first cap layer is exposed at the bottom of the first via. The upper portion of the first cap layer at the bottom of the first via may be removed when forming the first via.

The first via 108 can be formed by any suitable technique. For example, the first via can be formed by lithography, etching, and/or ashing techniques. The first via can be formed by an etching process such as a reactive ion etching (RIE). In one embodiment, the first via is formed by an RIE and ashing (e.g., plasma ashing). For example, the first via is formed using a plasma gas including CxFy gas such as $CF_4$, $CHF_3$, $C_2F_6$, $C_4F_8$, $CH_2F_2$, $CH_3F$, $C_4F_6$ gas, or the like. Ashing is conducted using an ashing gas such as $O_2$, $N_2$, $H_2$, $CO_2$, CO, or the like. The details of the etching process are not critical to the subject innovation. The details of the manufacture of a via and trench can be found in, for example, commonly-assigned U.S. Pat. Nos. 6,433,428 and 6,407,453, both of which are hereby incorporated by reference.

The etching process may cause damage to the sidewall surface of the first via (e.g., side surfaces of the first and/or second dielectric layer in the first via). The etching process may remove surface portions of the dielectric layer, causing surface erosion. Such erosion of the dielectric layer adversely changes the critical dimensions along the first via in the dielectric layer. Erosion causes adverse changes to the critical dimensions and the electrical characteristics of the circuit interconnects.

When the first and/or second dielectric layers contain porous ultra-low k dielectric materials (e.g., dielectric materials having a dielectric constant, k, of about 2.8 or less), the etching process may cause much damage to the sidewalls of the first via. When the first dielectric layer contains such a porous dielectric material and the second dielectric layer does not contain such a porous dielectric material, more portions of the sidewall surface of the first dielectric layer are removed than the sidewall surface of the second dielectric layer. As a result, the lateral dimension of the first via in the first dielectric layer is greater than the lateral dimension of the first via in the second dielectric layer. When the first dielectric layer and the second dielectric layer contain the same dielectric material, the lateral dimension of the first via in the first dielectric layer is substantially the same as the lateral dimension of the first via in the second dielectric layer (not shown).

Although not shown in FIG. 1, the interconnect structure can contain any suitable second interconnect structure thereunder. For example, the underlying second interconnect structure contains a dielectric layer and a conductive feature. The conductive feature can be located under the first via.

Figure 2:
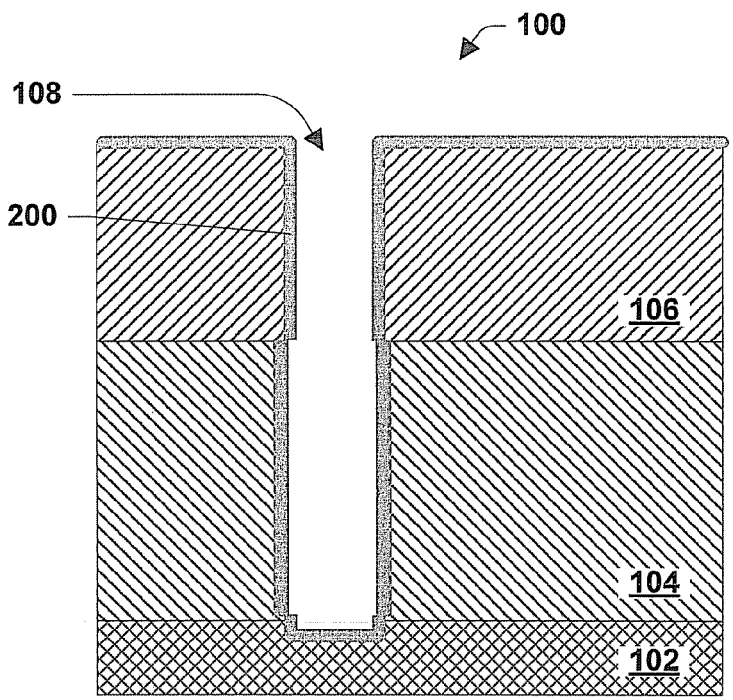

FIG. 2 illustrates forming a first metal layer 200 over the sidewall surface and bottom surface of the first via. The first metal layer is formed over the sidewall surfaces of first and/or second dielectric layers and the upper surface of the first cap layer in the first via. When the first and/or second dielectric layers have porous, the first metal layer can be formed in the porous at the surface of the sidewall surface of the first via.

The first metal layer 200 can contain any metal as long as the subsequently formed metal oxides can prevent and/or mitigate erosion of the sidewall surface of the first via. The first metal layer can contain substantially pure metal or a metal alloy containing two or more metals. Specific examples of metals include manganese (Mn), silicon (Si), aluminum (Al), titanium (Ti), tin (Sn), indium (In), cobalt (Co), or combinations thereof. Examples of alloys include metals selected from the group consisting of manganese (Mn), silicon (Si), aluminum (Al), titanium (Ti), tin (Sn), indium (In), and cobalt (Co).

The first metal layer 200 can be formed by any suitable technique. Examples of such techniques include physical vapor deposition (PVD), ionized plasma vapor deposition (IPVD), self-ionized plasma (SIP), atomic layer deposition (ALD), supercritical $CO_2$ ($SCCO_2$) deposition, chemical vapor deposition (CVD), metal organic chemical vapor deposition (MOCVD), plasma-enhanced chemical vapor deposition (PECVD), plasma-enhanced atomic layer deposition (PEALD), or the like.

The first metal layer 200 can have any suitable thickness that depends on the desired implementations of the interconnect structure. In one embodiment, the first metal layer has a thickness of about 0.1 nm or more and about 30 nm or less. In another embodiment, the first metal layer has a thickness of about 0.1 nm or more and about 25 nm or less. In yet another embodiment, the first metal layer has a thickness of about 0.1 nm or more and about 20 nm or less.

Figure 3A:
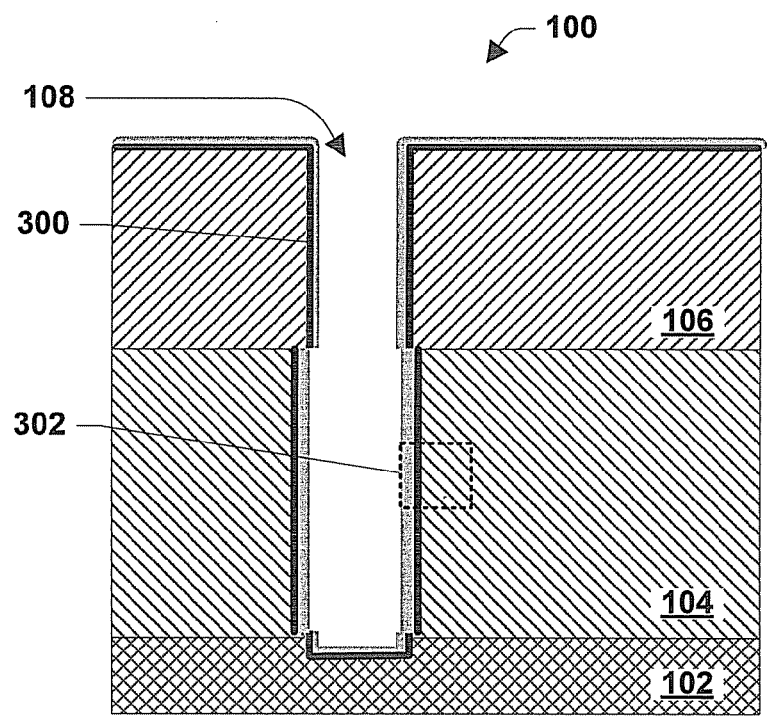
Figure 3B:
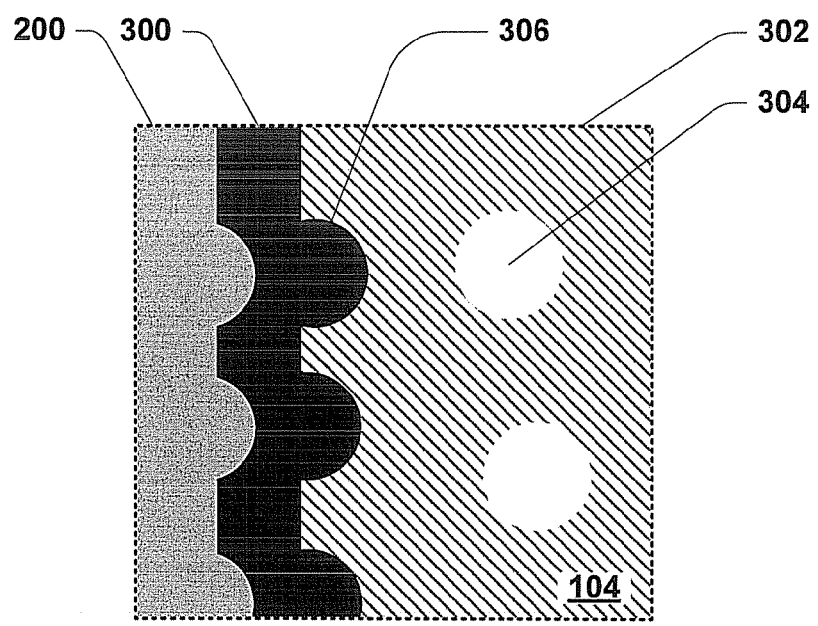

FIGS. 3a and 3b illustrate forming a first metal oxide layer 300 by oxidizing metal of the first metal layer. A portion of the first metal oxide layer indicated by a dashed line 302 of FIG. 3a is exploded in FIG. 3b.

The first metal oxide layer 300 can contain any suitable metal oxide as long as the metal oxide can prevent and/or mitigate erosion of sidewalls of the first via in the subsequent etching process. For example, the metal oxide contain one or more oxides of metal selected from the group consisting of manganese (Mn), silicon (Si), aluminum (Al), titanium (Ti), tin (Sn), indium (In), and cobalt (Co).

The first metal oxide layer 300 can be formed by any suitable technique. For example, the first metal oxide layer is formed by oxidizing metal of the first metal layer with oxygen from the first and/or second dielectric layers. Since the oxygen is provided from the first and/or second dielectric layers, the metal oxide can be formed at least on the surface of the first metal layer that is adjacent to the dielectric layers. In one embodiment, a portion of the metal of the first metal layer 200 is oxidized. In another embodiment, substantially all the portions of the first metal layer 200 is oxidized (not shown).

When the first and/or second dielectric layers have pores 304, the metal oxide can be formed in the pores 306 adjacent to the inner surface (e.g., sidewall surface and/or bottom surface) of the first via. Since the interconnect structure contains the first metal oxide layer over the inner surface of the first via, the first metal oxide layer can prevent and/or mitigate erosion of the inner surface of the first via in the subsequent etching process.

The first metal oxide layer 300 can be formed, for example, by annealing the first metal layer. The metal oxide can be formed by any suitable annealing condition as long as the resultant metal oxide can prevent and/or mitigate erosion of the inner surface of the first via in the subsequent etching process. In one embodiment, substantially all the metals of the first metal layer are oxidized, and substantially no unoxidized metal exists in the first metal oxide layer. In another embodiment, a portion of the first metal layer is oxidized and unoxidized metals exist in the first metal oxide layer.

In one embodiment, the first metal oxide layer 300 is formed at temperatures of about 50 degrees Celsius or more and about 500 degrees Celsius or less and for about 10 minutes or more and about 200 minutes or less. In another embodiment, the metal oxide is formed at temperatures of about 70 degrees Celsius or more and about 450 degrees Celsius or less and for about 20 minutes or more and about 150 minutes or less. In yet another embodiment, the metal oxide is formed at temperatures of about 100 degrees Celsius or more and about 400 degrees Celsius or less and for about 30 minutes or more and about 120 minutes or less. The metal oxide can be formed in a $N_2$ atmosphere or $N_2/H_2$ atmosphere.

Figure 4:
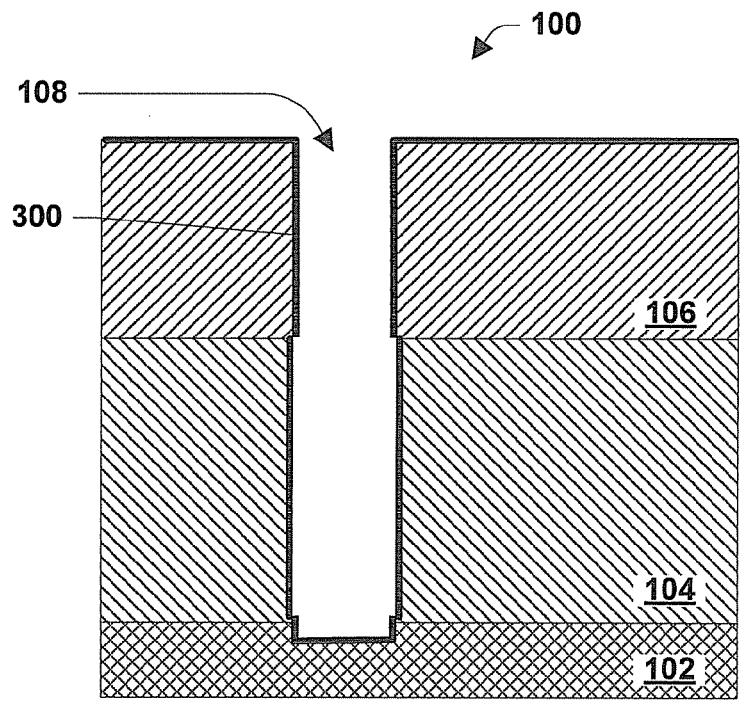

FIG. 4 illustrates removing unoxidized metal of the first metal oxide layer. When unoxidized metal exists in the first metal oxide layer, the unoxidized metal can be removed, for example, by etching with an acid (e.g., diluted acid solution). Any suitable acid solution can be employed as long as the acid solution can dissolve unoxidized metals of the first metal oxide layer into the acid solution. Examples of acids include mineral acids such as hydrochloric acid, nitric acid, sulfuric acid, nitric acid, phosphoric acid, hydrogen peroxide, aqua regia, combinations thereof, or the like. In one embodiment, the acid solution contains from about 1:5 to about 5:1 of hydrochloric acid and nitric acid by weight. When substantially no unoxidized metal exists in the first metal oxide layer, this process is not necessary (not shown).

Figure 5:
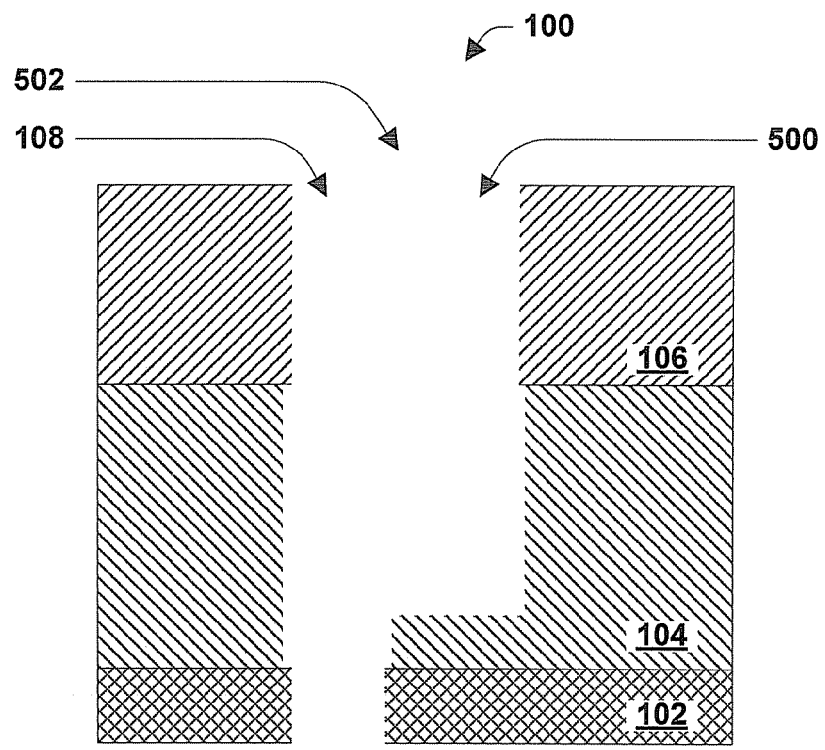

FIG. 5 illustrates forming a first trench 500 in the first and second dielectric layers adjacent to the first via, thereby forming a dual damascene structure 502. The first metal oxide layer prevents and/or mitigates erosion damage to the sidewall surface of the first via when making the first trench. The first trench can be formed by lithography and etching techniques. For example, the first trench is formed in the similar manner to that of the first via as described in connection with FIG. 1. The first trench can be formed by an RIE and/or wet etching. In this embodiment, substantially all the portions of first metal oxide layer are removed at the etching process. In addition, in this embodiment, a portion of the first cap layer at the bottom of the first via is removed at the same time and/or after forming the first trench. When the first cap layer contains silicon nitride, the portion of the first cap layer at the bottom of the first via can be removed by a SiN etch process using $NH_4F$, $CF_4$, or $CHF_3$.

Figure 6:
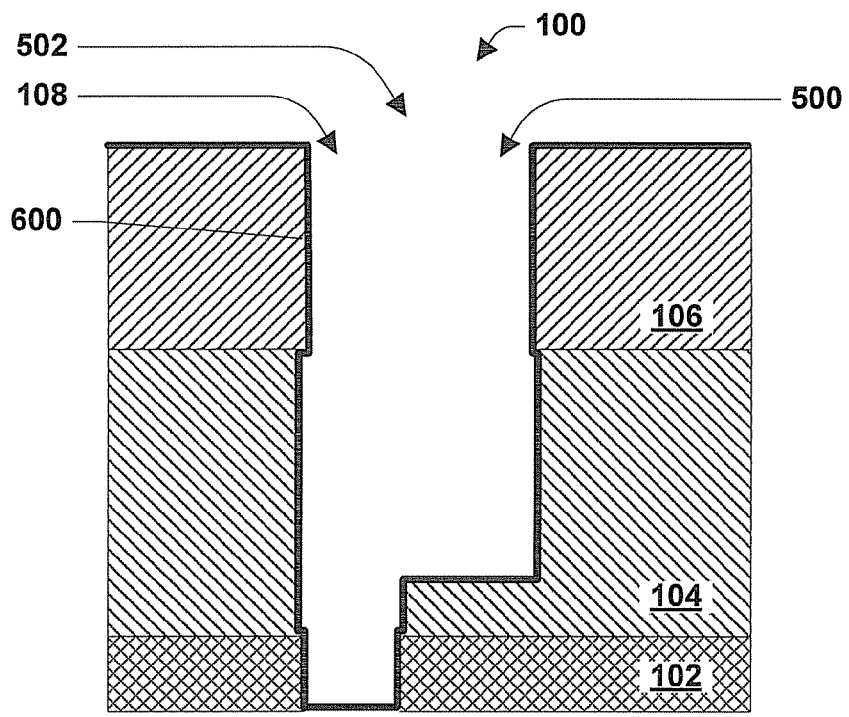

FIG. 6 illustrates forming a barrier layer 600 over sidewall surfaces and bottom surfaces of the first via and first trench. The barrier layer can contain any suitable material that can serve as a barrier to prevent conductive material from diffusing therethrough. For example, the barrier layer can contain tantalum (Ta), tantalum nitride (TaN), titanium (Ti), titanium nitride (TiN), ruthenium (Ru), ruthenium nitride (RuN), tungsten (W), tungsten nitride (WN), or combinations thereof.

The barrier layer 600 can have a thickness of about 1 nm or more and about 50 nm or less. In another embodiment, the barrier layer has a thickness of about 5 nm or more and about 40 nm or less. The barrier layer can be formed by any suitable technique such as PVD, IPVD, SIP, ALD, $SCCO_2$, CVD, MOCVD, PECVD, PEALD, or the like.

Figure 7:
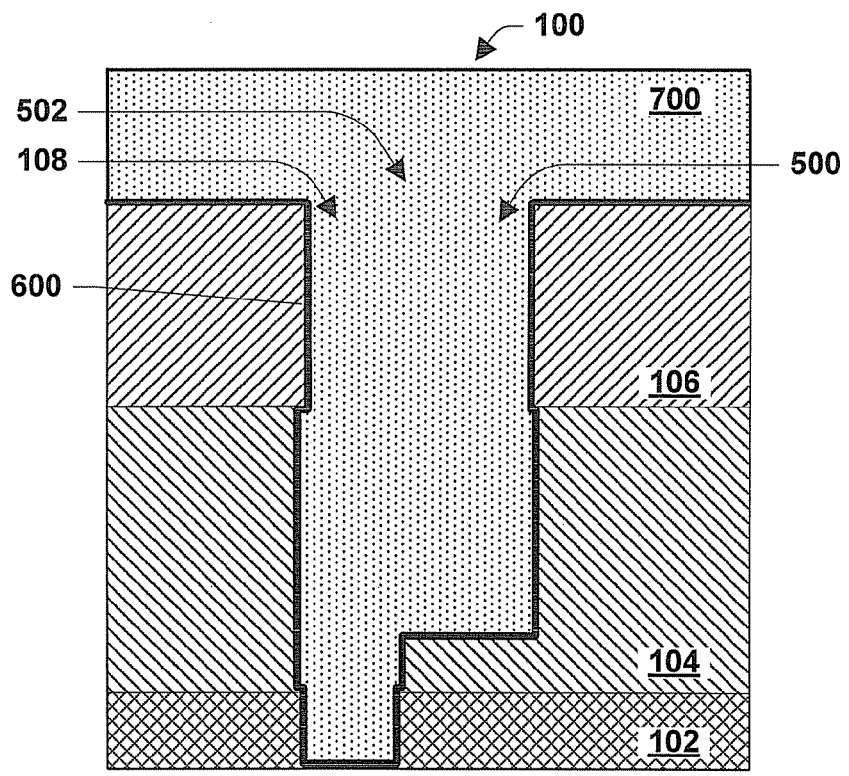

FIG. 7 illustrates forming a conductive material 700 in the first via and first trench over the second dielectric layer. The conductive material can contain copper (Cu) or an alloy of copper (Cu) and aluminum (Al). The conductive material can be formed by any suitable technique. The conductive material can be formed by forming a seed layer and by electrical plating. The thickness of conductive material can be about 300 nm or more and about 800 nm or less.

Figure 8:
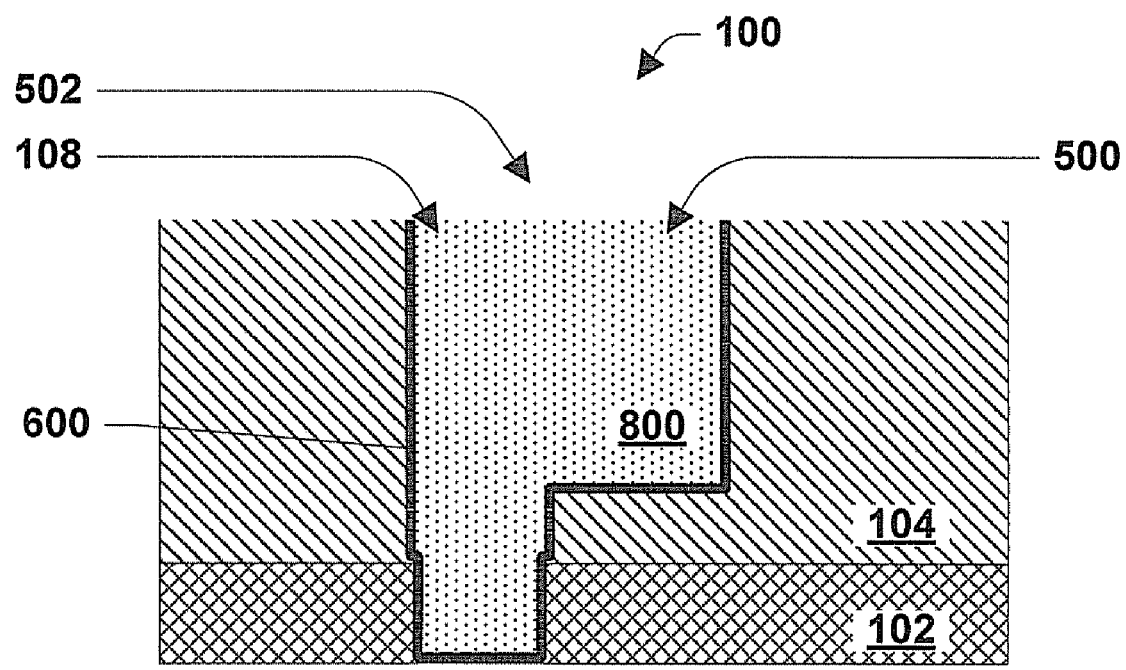

FIG. 8 illustrates removing the second dielectric layer, an upper portion of the first dielectric layer, and/or an upper portion of the conductive material, thereby forming an interconnect structure including a first conductive feature 800 in the first via and first trench. The second dielectric layer, upper portion of the first dielectric layer, and/or conductive material can be removed by chemical-mechanical polishing (CMP). Although not shown in FIG. 8, after forming the interconnect structure, a second cap layer and/or another interconnect structure can be formed thereon.

Although not shown in FIG. 8, the interconnect structure can contain any suitable second interconnect structure thereunder. The underlying second interconnect structure contains a conductive feature under the first via. The first conductive feature 800 is electrically connected to the conductive feature under the first cap layer.

Figure 9:
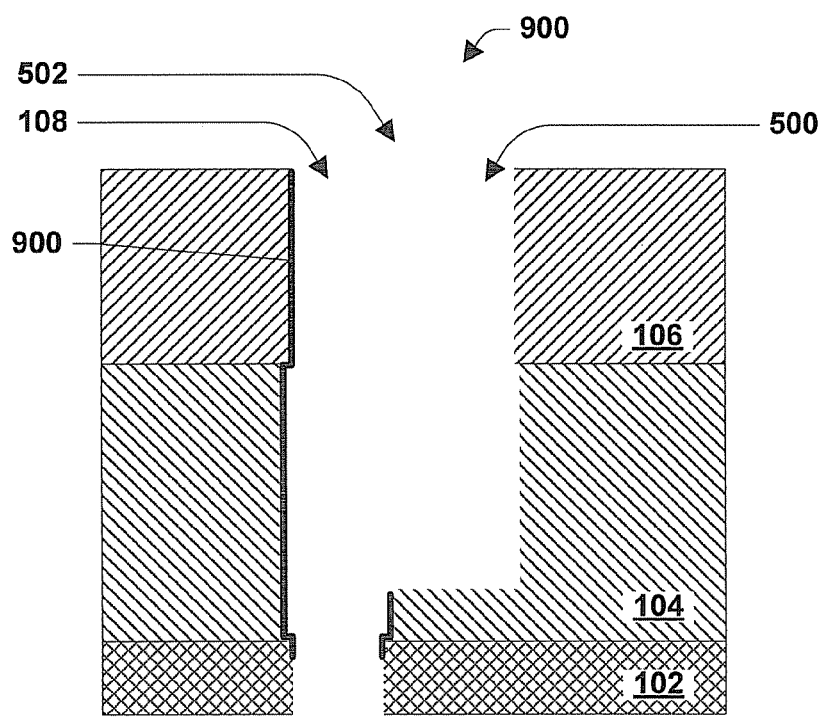
FIGS. 9 and 10 illustrate an exemplary methodology of forming an interconnect structure in accordance with an aspect of the subject innovation.
Figure 10:
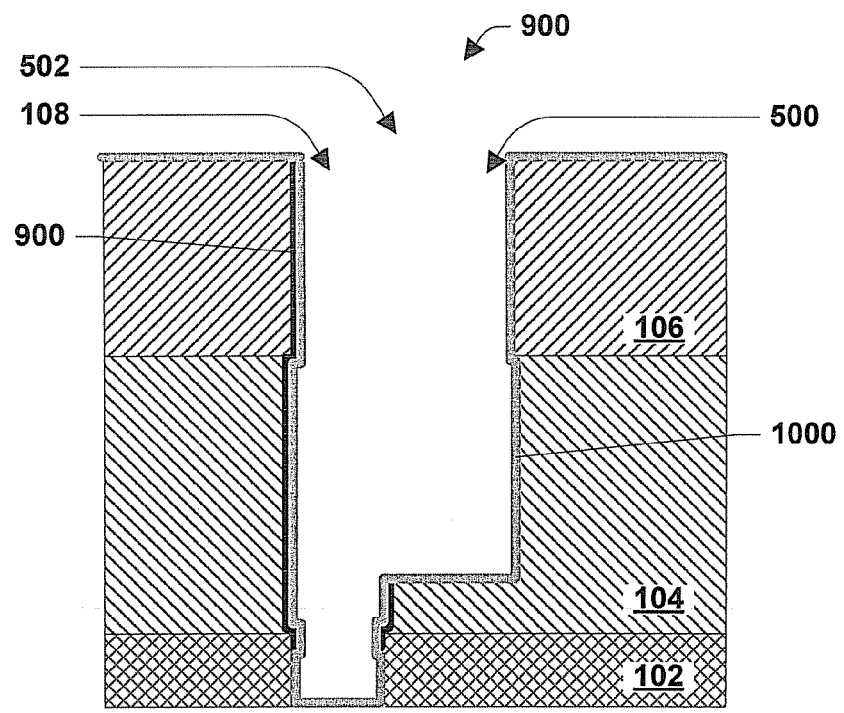

FIGS. 9 and 10 illustrate another exemplary method of making an interconnect structure. FIG. 9 illustrates a cross sectional view of an intermediate state of a portion of an exemplary interconnect structure 900 after forming a dual damascene structure (e.g., the first via 108 and first trench 500) 502. The interconnect structure can contain the same features as the interconnect structure as described in connection with FIG. 5 except that a portion 900 of first metal oxide layer 300 is remained over the sidewall surface of the first via. The remained portion of the first metal oxide layer is over at least a portion of the sidewall of the first via.

FIG. 10 illustrates forming a barrier layer 1000 over at least sidewall surfaces and bottom surfaces of the first via and first trench. The barrier layer can contain any suitable material that can serve as a barrier to prevent conductive material from diffusing therethrough, such as tantalum (Ta), tantalum nitride (TaN), titanium (Ti), titanium nitride (TiN), ruthenium (Ru), ruthenium nitride (RuN), tungsten (W), tungsten nitride (WN), or combinations thereof. The barrier layer can have a thickness of about 1 nm or more and about 50 nm or less. In another embodiment, the barrier layer has a thickness of about 5 nm or more and about 40 nm or less. Although not shown in FIG. 10, after forming the barrier layer, a conductive feature and/or a second cap layer can be formed in the same manner as described in connection with FIGS. 7 and 8.

Figure 11:
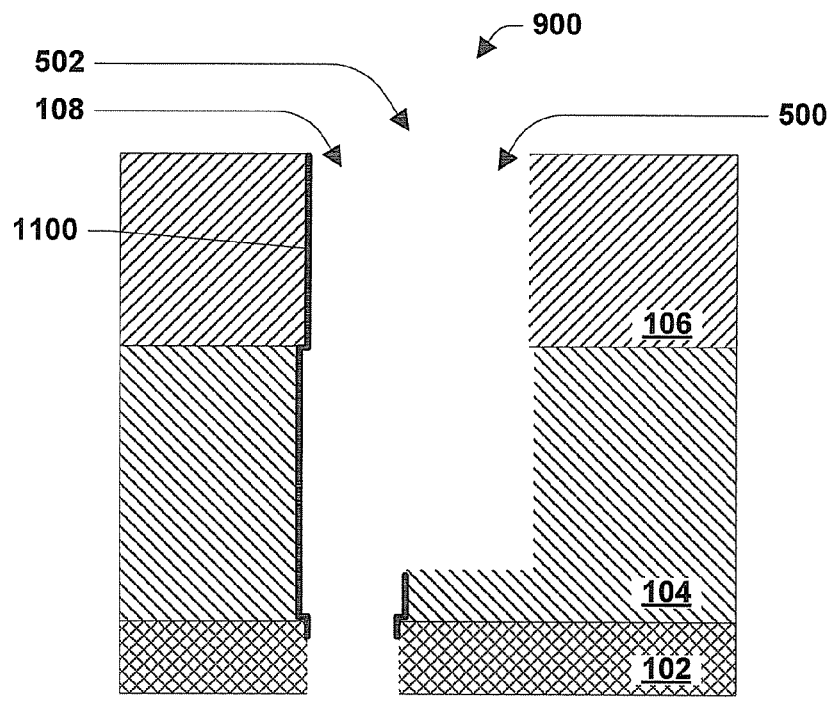
FIGS. 11 and 12 illustrate an exemplary methodology of forming an interconnect structure in accordance with an aspect of the subject innovation.
Figure 12:
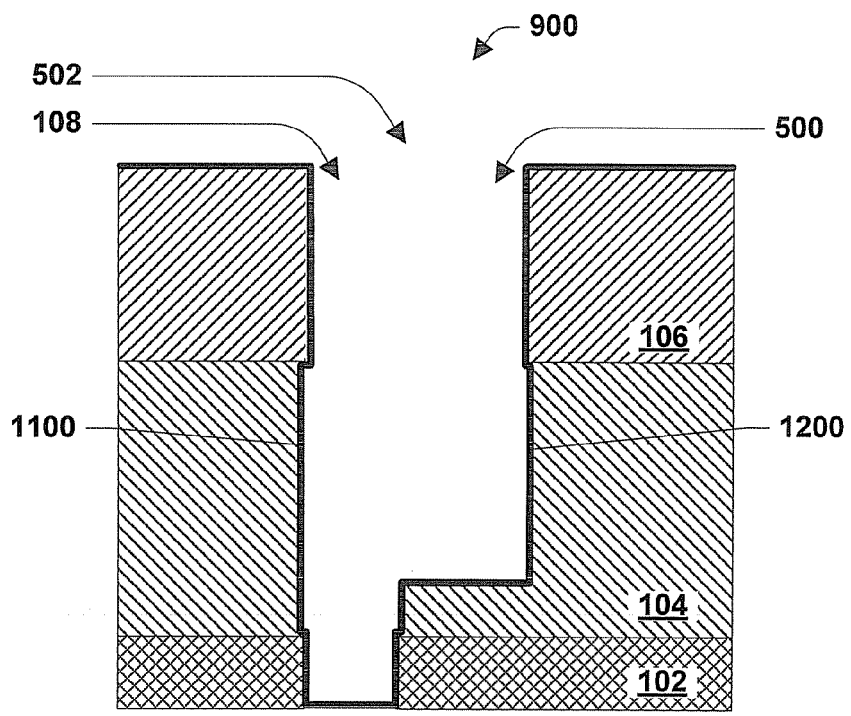

FIGS. 11 and 12 illustrate yet another exemplary method of making an interconnect structure. FIG. 11 illustrates a cross sectional view of an intermediate state of a portion of an exemplary interconnect structure 1100 after forming a dual damascene structure (e.g., the first via 108 and first trench 500) 502. The interconnect structure 1000 can contain the same features as the interconnect structure as described in connection with FIG. 5 except that a portion 1100 of first metal oxide layer 300 is remained over the sidewall surface of the first via. The remained portion of the first metal oxide layer is over at least a portion of the sidewall of the first via. Although not shown in FIG. 11, in another embodiment, substantially all the portions of the first metal oxide layer are removed and substantially no first metal oxide layer is remained.

FIG. 12 illustrates forming a second metal oxide layer 1200 over at least the sidewall surface and bottom surface of the first trench. When portions or all of the first metal oxide layer are removed, the second metal oxide layer can be formed over the surface where the first metal oxide layer is removed. The second metal oxide layer can contain any suitable material such as one or more oxides of metal selected from the group consisting of manganese (Mn), silicon (Si), aluminum (Al), titanium (Ti), tin (Sn), indium (In), and cobalt (Co).

The second metal oxide layer 1200 can be formed by forming a second meal layer (not shown) and oxidizing the metal of the second metal layer. The second metal layer can contain substantially pure metal or a metal alloy containing two or more metals. Specific examples of metals include manganese (Mn), silicon (Si), aluminum (Al), titanium (Ti), tin (Sn), indium (In), cobalt (Co), or combinations thereof. Examples of alloys include metals selected from the group consisting of manganese (Mn), silicon (Si), aluminum (Al), titanium (Ti), tin (Sn), indium (In), and cobalt (Co). The second metal layer be formed by any suitable technique such as PVD, IPVD, SIP, ALD, $SCCO_2$, CVD, MOCVD, PECVD, PEALD, or the like.

The second metal oxide layer 1200 can have any suitable thickness that depends on the desired implementations of the interconnect structure. In one embodiment, the second metal oxide layer has a thickness of about 0.1 nm or more and about 30 nm or less. In another embodiment, the second metal oxide layer has a thickness of about 0.1 nm or more and about 25 nm or less. In yet another embodiment, the second metal oxide layer has a thickness of about 0.1 nm or more and about 20 nm or less.

The metal of the second metal layer can be oxidized, for example, by annealing in the same manner as described in connection with FIGS. 3a and 3b. Since the oxygen is provided from the first and/or second dielectric layers, the metal oxide can be formed at least on the surface of the second metal layer that is adjacent to the dielectric layers. When unoxidized metal exists in the second metal oxide layer, the unoxidized metal can be optionally removed, for example, by etching with an acid (diluted acid solution).

Although not shown in FIG. 12, after making the second metal oxide layer, a conductive feature and/or a second cap layer can be formed in the same manner as described in connection with FIGS. 7 and 8. In another embodiment, after making the second metal oxide layer, a barrier layer and/or a seed metal layer are formed over the second metal oxide layer, and then a conductive feature and/or a second cap layer can be formed in the same manner as described in connection with FIGS. 7 and 8.

Figure 13:
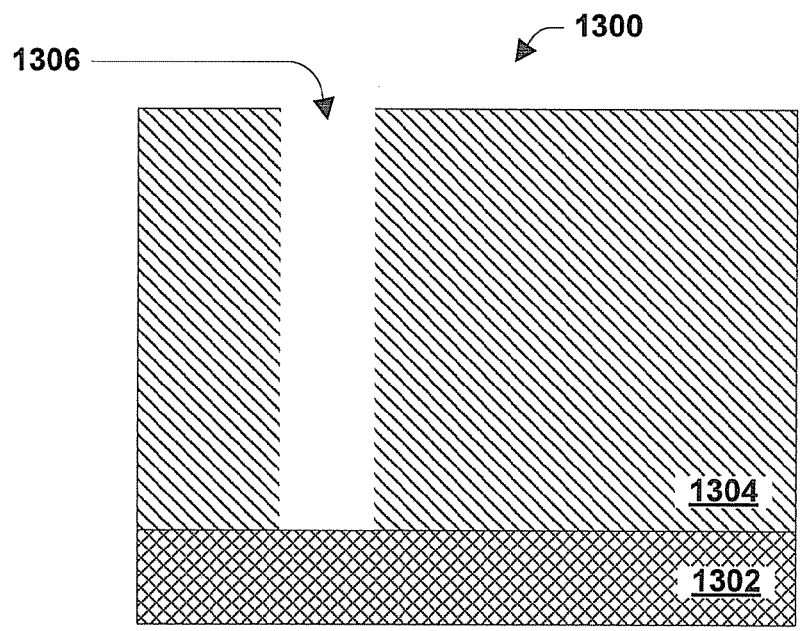
FIGS. 13 to 16 illustrate an exemplary methodology of forming an interconnect structure in accordance with an aspect of the subject innovation.

FIGS. 13 to 16 illustrate another exemplary method of making an interconnect structure. FIG. 13 illustrates a cross sectional view of an intermediate state of an exemplary interconnect structure 1300. The interconnect structure can contain a first cap layer 1302, a first dielectric layer 1304 over the first cap layer. The interconnect structure contains a first via 1306 extending through the first dielectric layer.

The first cap layer 1302 can contain any suitable dielectric capping material such as silicon carbide (SiC), silicon nitride (SiN), silicon carbon nitride (SiCN), tetrasilicon ammonia ($Si_4NH_3$), silicon oxide ($SiO_2$), a carbon doped oxide, a nitrogen and hydrogen doped silicon carbide SiC(N,H), or multiple layers thereof. The first cap layer has a thickness of about 10 nm or more and about 50 nm or less.

The first dielectric layer 1304 can contain any suitable interlevel or intralevel dielectric including inorganic dielectrics or organic dielectrics. The dielectric material can be porous or non-porous. The first dielectric layer contains one or more dielectric layers. When the first dielectric layer contains two or more dielectric layers, the layers can be the same or different from each other. Examples of dielectric materials include silicon containing materials such as FSG, SiCOH, HSQ, and MSQ, OSG, and highly porous $SiO_2$, or organics such as parylene, BCB, polyphenylene oligomer, fluorocarbons, and combinations thereof.

The first dielectric layer 1304 can have any suitable thickness that depends on the desired implementations of the interconnect structure. In one embodiment, the first dielectric layer has a thickness of about 50 nm or more and about 1,000 nm or less. In another embodiment, the first dielectric layer has a thickness of about 100 nm or more and about 800 nm or less. In yet another embodiment, the first dielectric layer has a thickness of about 200 nm or more and about 500 nm or less.

The first dielectric layer 1304 can have a low dielectric constant. The first dielectric layer has a dielectric constant less than that of $SiO_2$. In one embodiment, the first dielectric layer has a dielectric constant less than about 3.0. In another embodiment, the first dielectric layer has a dielectric constant less than about 2.6. In yet another embodiment, the first dielectric layer has a dielectric constant less than about 2.3.

The first via 1306 extends through the first dielectric layer. A portion of upper surface of first cap layer is exposed at the bottom of the first via. The upper portion of the first cap layer at the bottom of the first via may be removed when forming the first via (not shown). The first via can be formed by any suitable technique including lithography, etching, and ashing techniques in the same manner as described in connection with FIG. 1.

Figure 14:
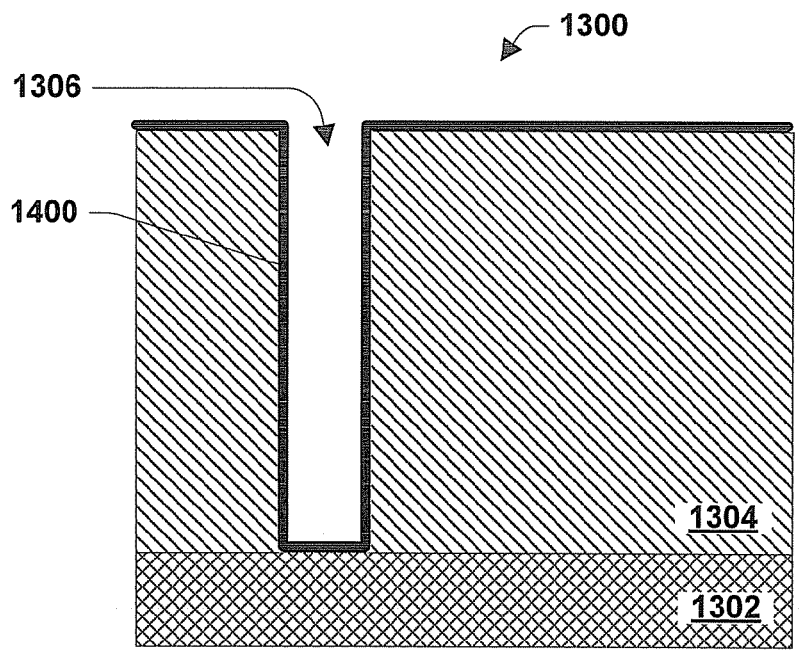

FIG. 14 illustrates forming a first metal oxide layer 1400 over the sidewall surface and bottom surface of the first via. The first metal oxide can be formed, for example, by forming a first metal layer (not shown) and oxidizing the first metal layer by annealing. When unoxidized metal exists in the first metal oxide layer, the unoxidized metal can be optionally removed, for example, by etching with an acid (e.g., diluted acid solution). The first metal oxide layer can be formed in the same manner as the first metal oxide layer 300 as described in connection with FIGS. 2, 3a, 3b, and 4.

Figure 15:
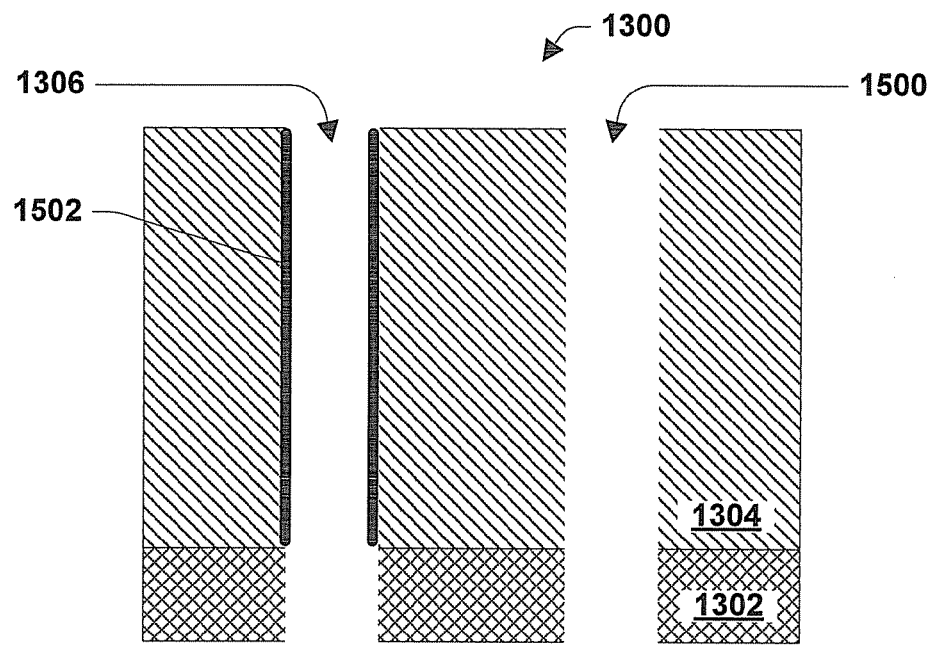

FIG. 15 illustrates forming a second via 1500. The first metal oxide layer prevents and/or mitigates erosion damage to the sidewall surface of the first via when making the second via. The second via extends through the first dielectric layer and the first cap layer. A portion of the first cap layer at the bottom of the first cap layer can be removed at the same time and/or after forming the second via.

The second via can be formed by any suitable technique. For example, the second via can be formed by lithography, etching, and ashing techniques. The second via of the first dielectric layer can be formed by an RIE. When the first cap layer contains silicon nitride, the second via of the first cap layer can be formed by a SiN etch process using $NH_4F$, $CF_4$, or $CHF_3$.

In this embodiment, a portion 1502 of the first metal oxide layer 1400 are remained after forming the second via. Although not shown, in another embodiment, substantially all the portions of the first metal oxide are removed at the same time and/or after forming the second via.

Figure 16:
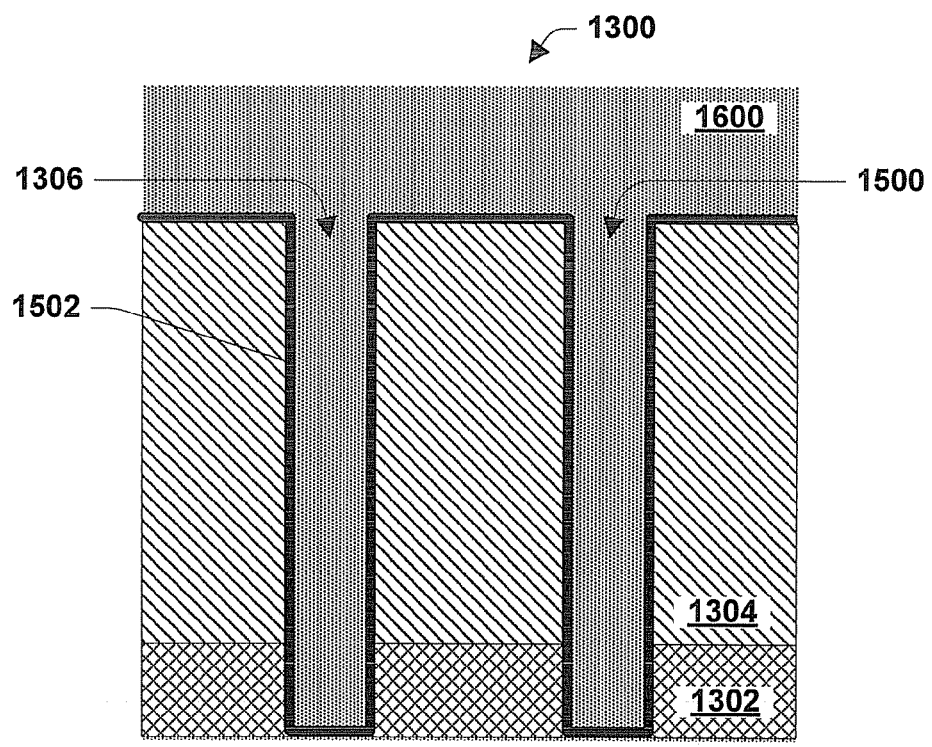

FIG. 16 illustrates forming a conductive material 1600 over the first dielectric layer in the first and second vias. The conductive material can be formed by forming a seed metal layer and electrical plating. Although not shown, the interconnect structure 1300 can contain any suitable second interconnect structure thereunder. The underlying second interconnect structure can contain second conductive features. The second conductive features can be located under the first via and the second via, and the conductive material 1600 formed over the first dielectric layer can be electrically connected to the second conductive features.

Although not shown, a barrier layer and/or a second metal oxide layer can be optionally formed sidewall surfaces of the first and/or second vias. The barrier layer can be formed in the same manner as the barrier layer 600 as described in connection with FIG. 6. The second metal oxide layer can be formed in the same manner as the first metal oxide layer 300 as described in connection with FIGS. 2, 3a, 3b, and 4.

Although not shown in FIG. 16, after forming the conductive material 1600, an upper portion of the interconnect structure can be removed, for example, by CMP, and a second cap layer can be formed over the first dielectric layer in the same manner as described in connection with FIGS. 7 and 8.

Figure 17:
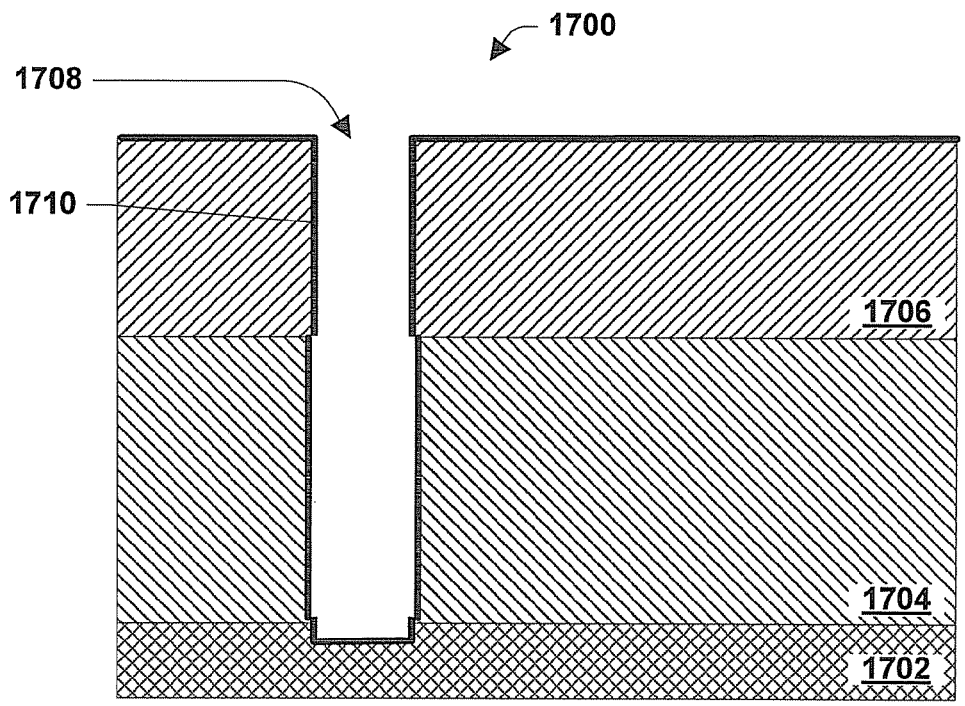
FIGS. 17 to 21 illustrate an exemplary methodology of forming an interconnect structure in accordance with an aspect of the subject innovation.

FIGS. 17 to 21 illustrate yet another exemplary method of making an interconnect structure. FIG. 17 illustrate a cross sectional view of an intermediate state of an exemplary interconnect structure 1700. The interconnect structure can contain a first cap layer 1702, a first dielectric layer 1704 over the first cap layer, and a second dielectric layer 1706 over the first dielectric layer. The interconnect structure contains a first via 1708 extending through the first and second dielectric layers. The interconnect structure further contains a first metal oxide layer 1710 over the sidewall surface and bottom surface of the first via. The interconnect structure can contain the same features as the interconnect structure 100 as described in connection with FIG. 4.

Figure 18:
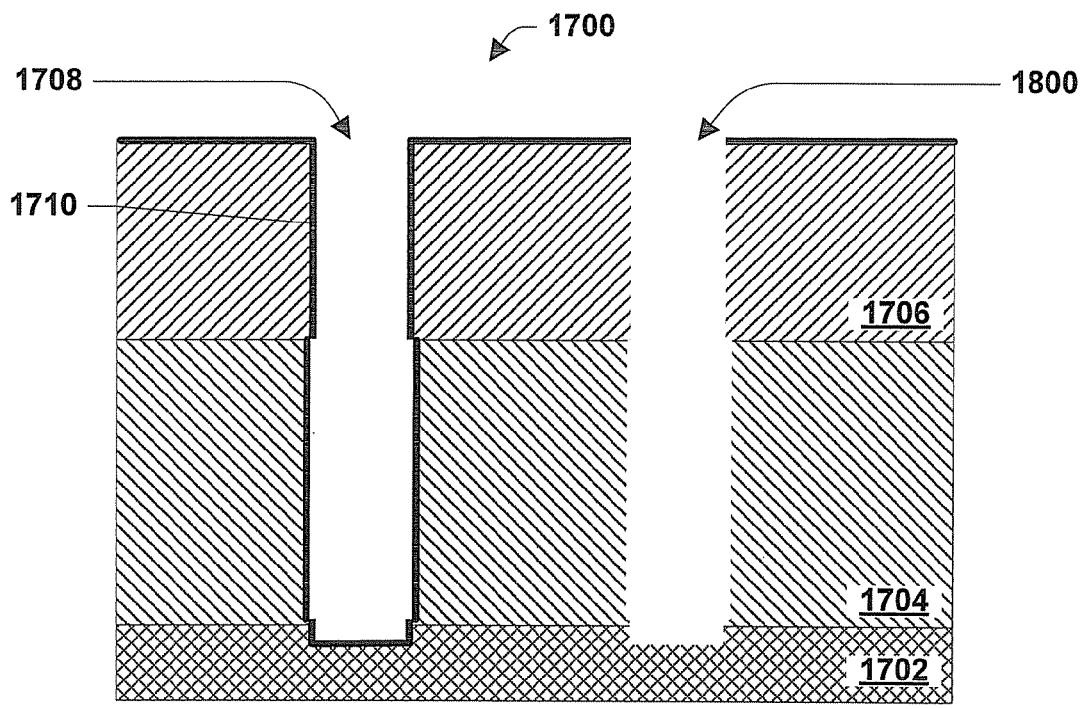

FIG. 18 illustrates forming a second via 1800. The first metal oxide layer 1710 prevents and/or mitigates erosion damage to the sidewall surface of the first via when making the second via. The second via extends through the first and second dielectric layers. The second via can be formed by any suitable technique, for example, lithography and etching (e.g., RIE) techniques. The second via can be formed in the same manner as the first via 108 as described in connection with FIG. 1.

Figure 19:
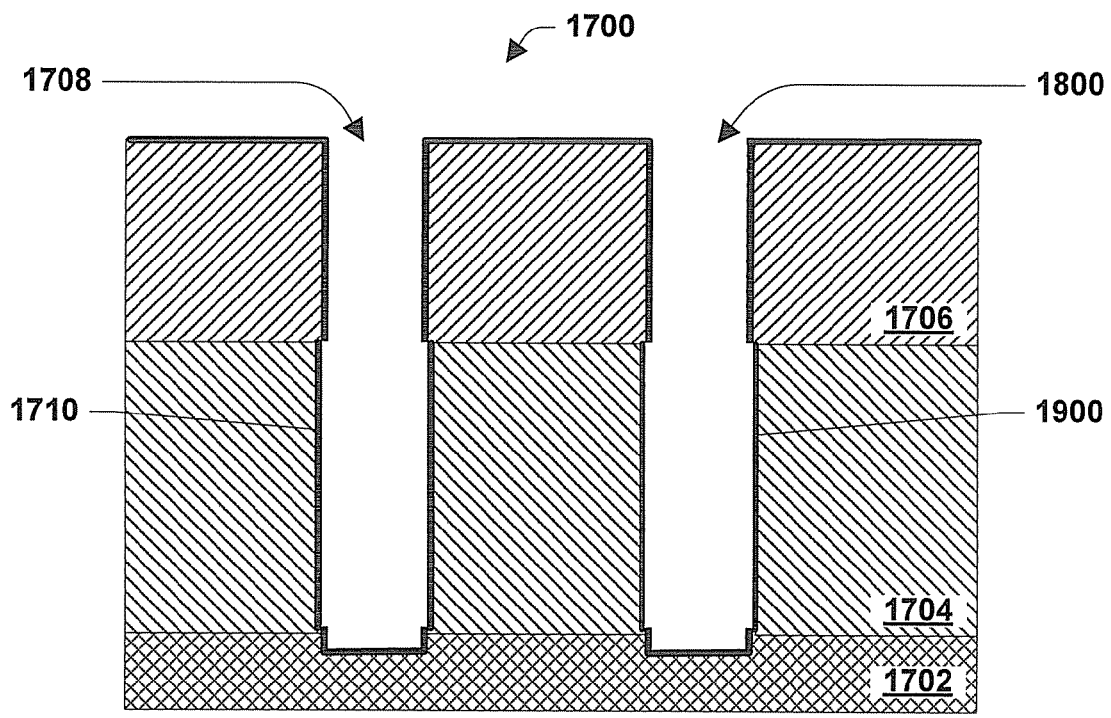

FIG. 19 illustrate a second metal oxide layer 1900 over at least sidewall surface of the second via. The second metal oxide layer can be formed in the same manner as the first metal oxide layer 300 as described in connection with FIGS. 2, 3a, 3b, and 4.

Figure 20:
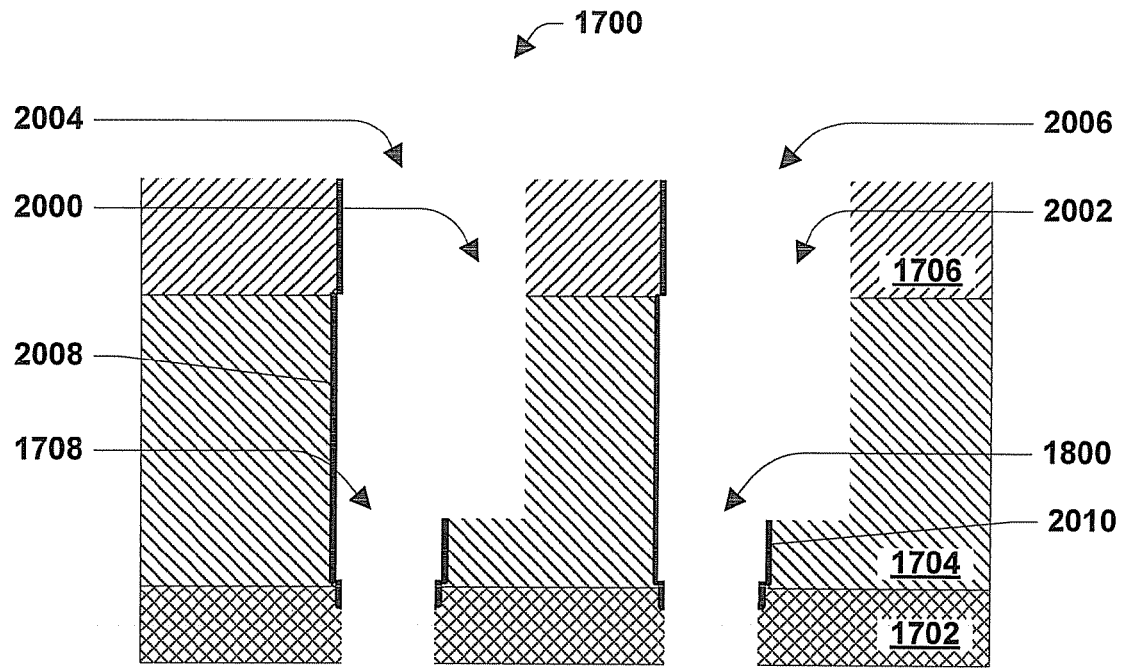

FIG. 20 illustrates forming first and second trenches 2000, 2002 in the first and second dielectric layers. The first trench 2000 is formed adjacent to the first via, thereby forming a first dual damascene structure 2004. The second trench 2002 is formed adjacent to the second via, thereby forming a second dual damascene structure 2006.

The trenches can be formed by lithography and etching (e.g., an RIE and wet etching) techniques. The trenches can be formed in the similar manner as the trench 500 as described in connection with FIG. 5. The first and second metal oxide layers prevent and/or mitigate erosion damage to the sidewall surfaces of the first and second vias when making the trenches. An upper portion of the second dielectric layer can be removed when forming the trenches.

In this embodiment, portions 2008, 2010 of the first and/or second metal oxide layers are remained after forming the trenches. In another embodiment, substantially all the portions of the first and second metal oxide layers are removed at the same time and/or after forming the first and second trenches, and substantially no portions of the first and second metal oxide layers are remained (not shown).

In this embodiment, portions of the first cap layer at the bottom of the first and second vias are removed at the same time and/or after forming the trenches. When the first cap layer contains silicon nitride, the portions of the first cap layer can be removed by a SiN etch process.

Figure 21:
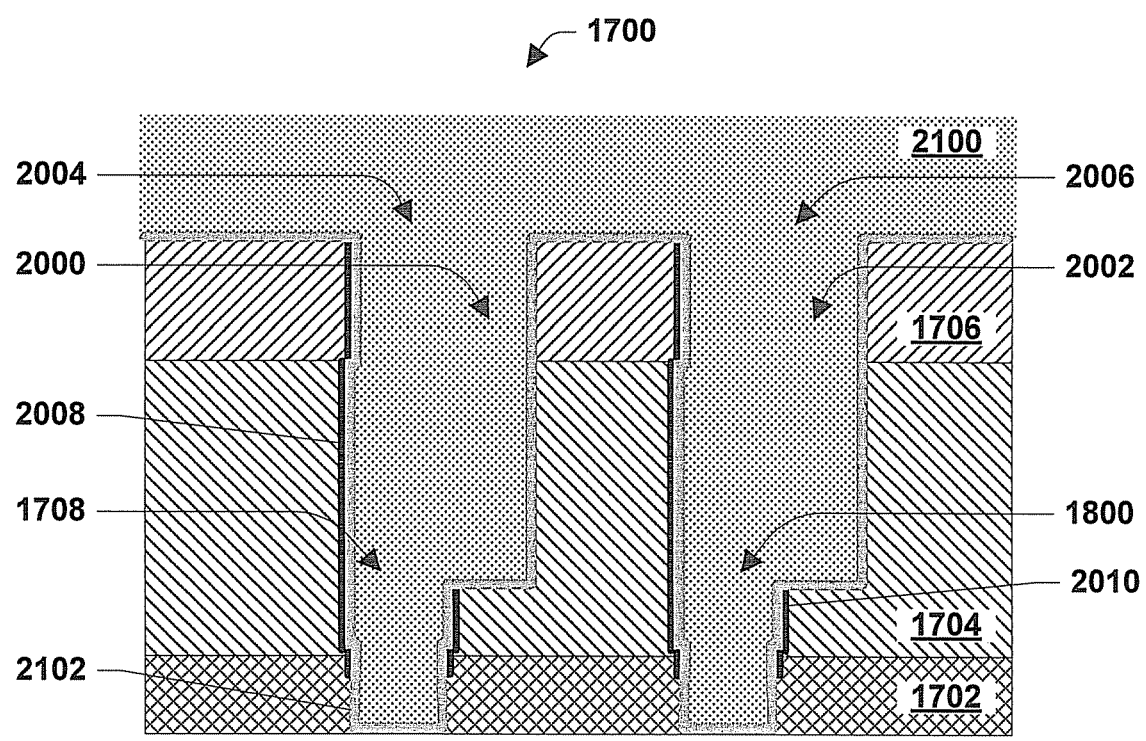

FIG. 21 illustrates forming a conductive material 2100 over the second dielectric layer in the first and second dual damascene structures. The conductive material can be formed by forming a seed metal layer and electrical plating. Although not shown, the interconnect structure 1700 can contain any suitable second interconnect structure thereunder. The underlying second interconnect structure can contain second conductive features. The second conductive features can be located under the first via and second via, and the conductive material 2100 formed over the second dielectric layer can be electrically connected to the second conductive features through the first via and second via.

A barrier layer and/or a second metal oxide layer 2102 can be optionally formed sidewall surfaces of the first and second vias and the first and second trenches. The barrier layer can be formed in the same manner as the barrier layer 1000 as described in connection with FIG. 10. The second metal oxide layer can be formed in the same manner as the second metal oxide layer 1200 as described in connection with FIG. 12.

Although not shown in FIG. 21, after forming the conductive material over the second dielectric layer, an upper portion of the interconnect structure can be removed, for example, by CMP, and a second cap layer can be formed over the first dielectric layer in the same manner as described in connection with FIGS. 7 and 8.

Figure 22:
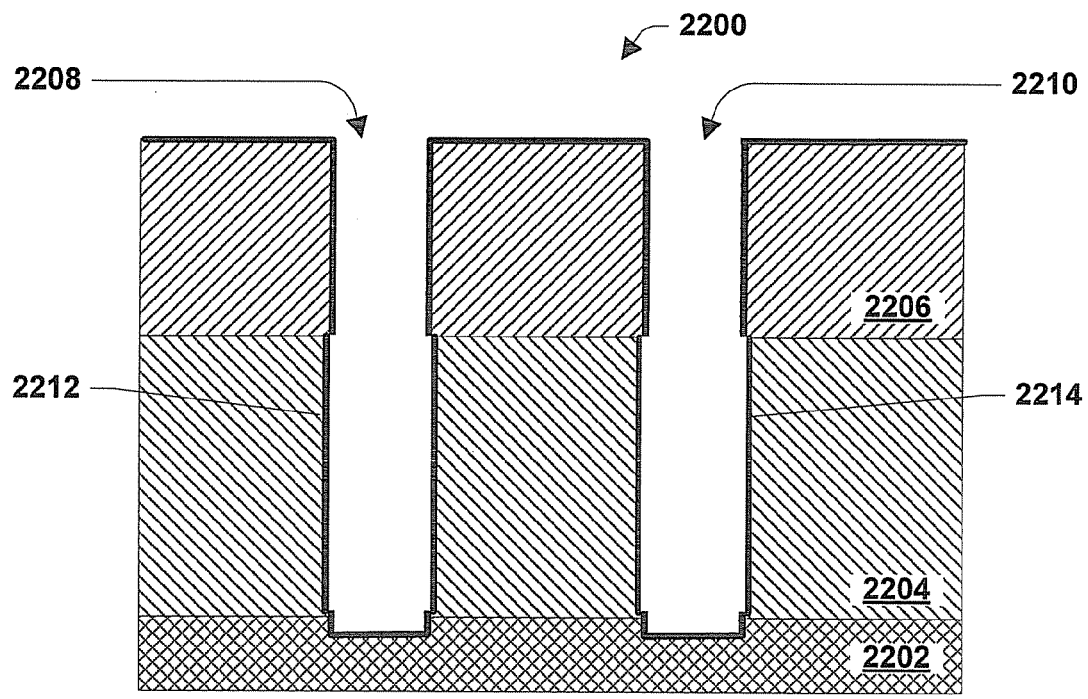
FIGS. 22 to 26 illustrate an exemplary methodology of forming an interconnect structure in accordance with an aspect of the subject innovation.

FIGS. 22 to 26 illustrate a still yet another exemplary method of making an interconnect structure. FIG. 22 illustrate a cross sectional view of an intermediate state of an exemplary interconnect structure 2200. The interconnect structure can contain the same features as the interconnect structure 1700 as described in connection with FIG. 19. The interconnect structure 2200 can contain a first cap layer 2202, a first dielectric layer 2204 over the first cap layer, and a second dielectric layer 2206 over the first dielectric layer. The interconnect structure 2200 contains first and second vias 2208, 2210 extending through the first and second dielectric layers. The interconnect structure further contains a first metal oxide layer 2212 over at least the sidewall surface of the first via and a second metal oxide 2214 over at least the sidewall surface of the second via.

Figure 23:
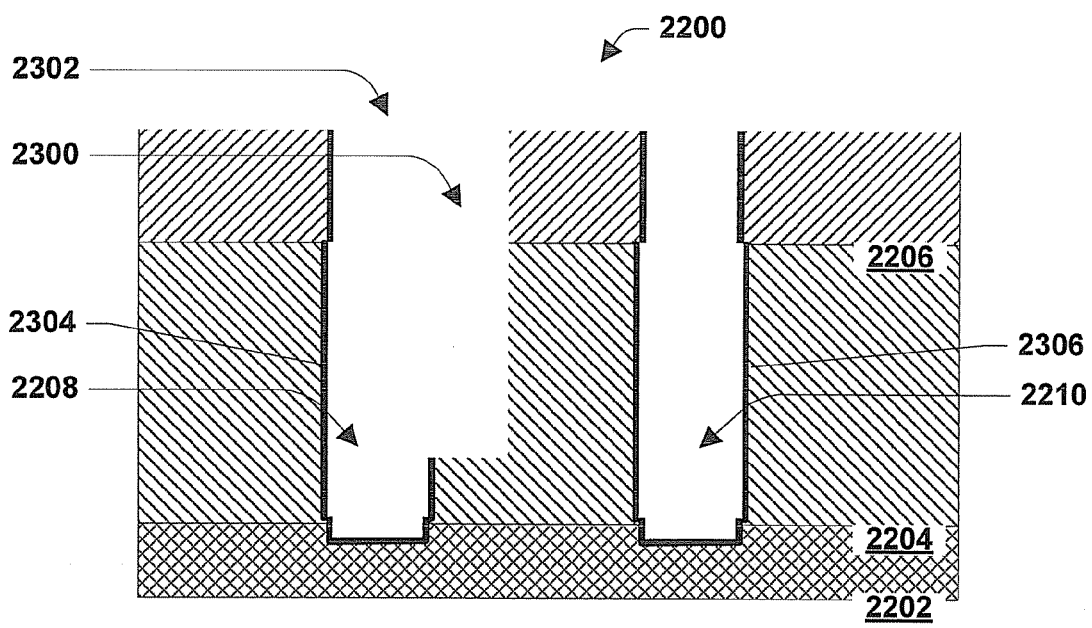

FIG. 23 illustrates forming a first trench 2300 in the first and second dielectric layers adjacent to the first via, thereby forming a first dual damascene structure 2302. The first trench can be formed by lithography and etching (e.g., an RIE) techniques. The first and second metal oxide layers prevent and/or mitigate erosion damage to the sidewall surfaces of the first and second vias when making the first trench. An upper portion of the second dielectric layer can be removed when forming the first trench. The first trench can be formed in the same manner as the trench 500 as described in connection with FIG. 5.

In this embodiment, at least portions 2304, 2306 of the first and/or second metal oxide layers are remained after forming the first trench. Although not shown, in another embodiment, substantially all the portions of the first and second metal oxide layers are removed at the same time and/or after forming the first trench.

Figure 24:
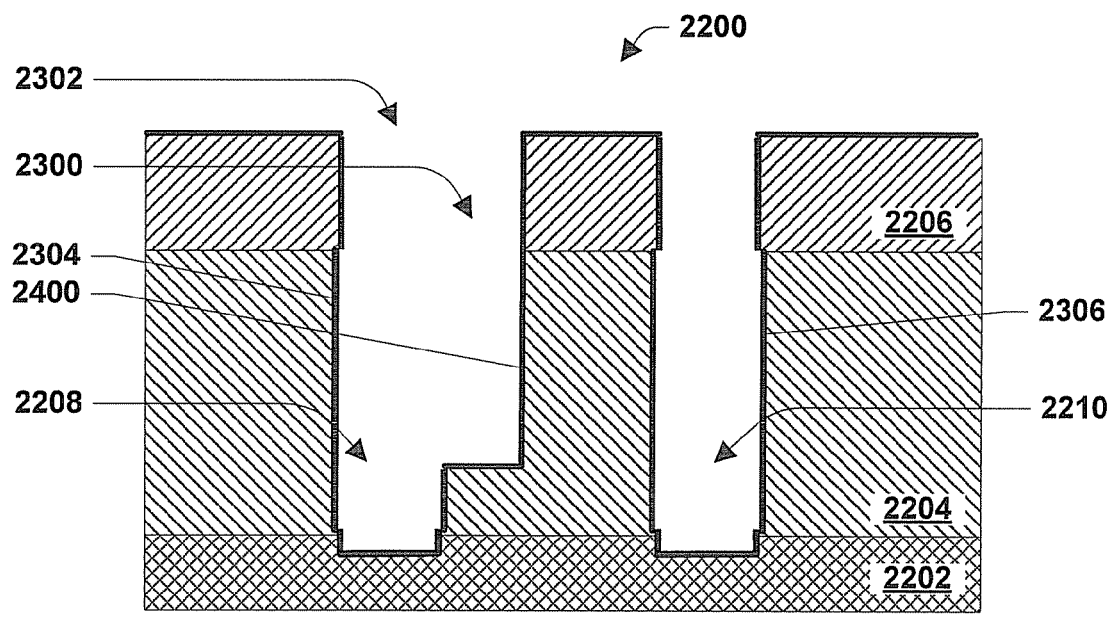

FIG. 24 illustrates forming a third metal oxide layer 2400 over at least sidewall surface and bottom surface of the first trench 2300. The third metal oxide can be formed in the same manner as the first metal oxide layer 300 as described in connection with FIGS. 2, 3a, 3b, and 4.

Figure 25:
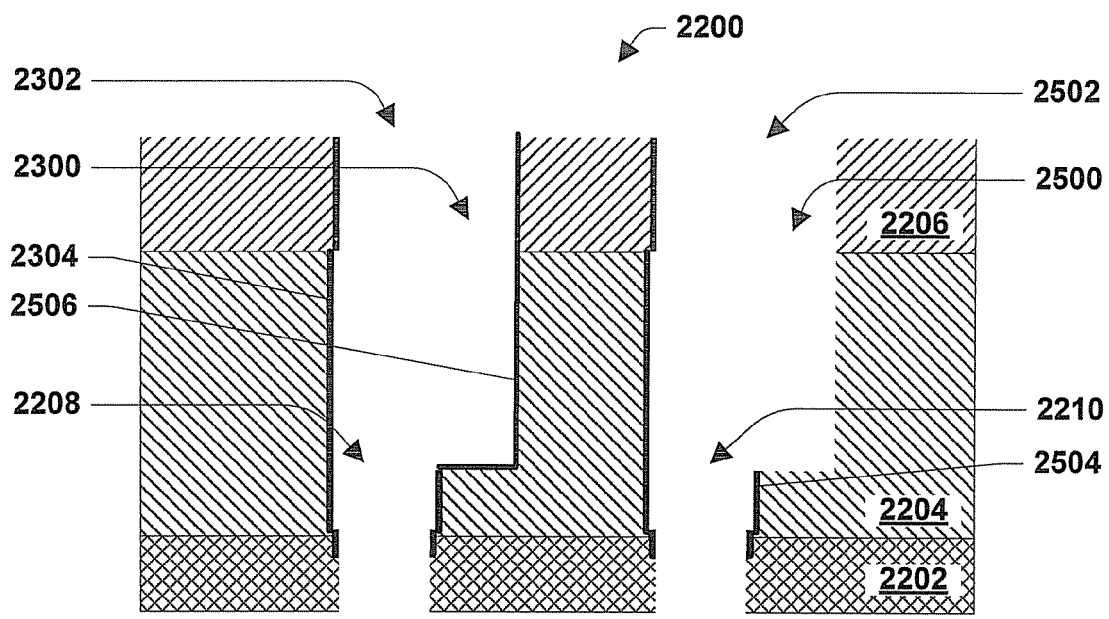

FIG. 25 illustrates forming a second trench 2500 in the first and second dielectric layers adjacent to the second via, thereby forming a second dual damascene structure 2502. The first, second, and/or third metal oxide layers prevent and/or mitigate erosion damage to the sidewall surfaces of the first and second vias and/or the sidewall surface and bottom surface of the first trench when making the second trench.

The second trench 2500 can be formed by lithography and etching (e.g., an RIE) techniques. An upper portion of the second dielectric layer can be removed when forming the second trench. The second trench can be formed in the same manner as the trench 500 as described in connection with FIG. 5.

In this embodiment, portions 2304, 2504, 2506 of the first, second, and/or third metal oxide layers are remained after forming the second trench. Although not shown, in another embodiment, substantially all the portions of the first, second, and third metal oxide layers are removed when formation of the second trench.

Figure 26:
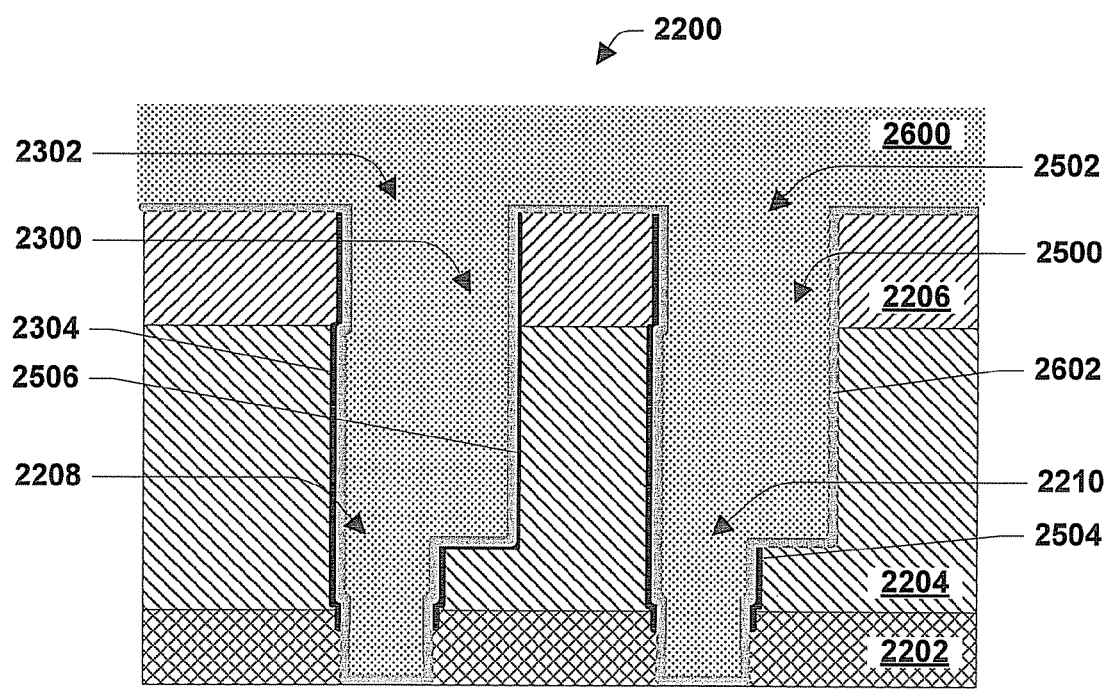

FIG. 26 illustrates forming a conductive material 2600 over the second dielectric layer in the first and second dual damascene structures. The conductive material can be formed by forming a seed metal layer and electrical plating. Although not shown, the interconnect structure can contain any suitable second interconnect structure thereunder. The underlying second interconnect structure can contain second conductive features. The second conductive features can be located under the first via and second via, and the conductive material 2600 formed over the second dielectric layer can be electrically connected to the second conductive features through the first via and second via.

In one embodiment, a fourth metal oxide layer and/or a barrier layer 2602 are optionally formed over at least one of the sidewall surfaces and bottom surfaces of the first and second vias and the sidewall surfaces and bottom surfaces of the first and second trenches. When portions or substantially all of the first, second, and/or third metal oxide layers are removed, the fourth metal oxide layer can be formed over the surface where the first, second, and/or third metal oxide layer are removed. The fourth metal oxide layer can be formed in the same manner as the first metal oxide layer 300 as described in connection with FIGS. 2, 3a, 3b, and 4. The barrier layer can be formed in the same manner as the barrier layer 600 as described in connection with FIG. 6.

Although not shown in FIG. 26, after forming the conductive material over the second dielectric layer, an upper portion of the interconnect structure can be removed, for example, by CMP, and a second cap layer can be formed over the first dielectric layer in the same manner as described in connection with FIGS. 7 and 8.

Figure 27:
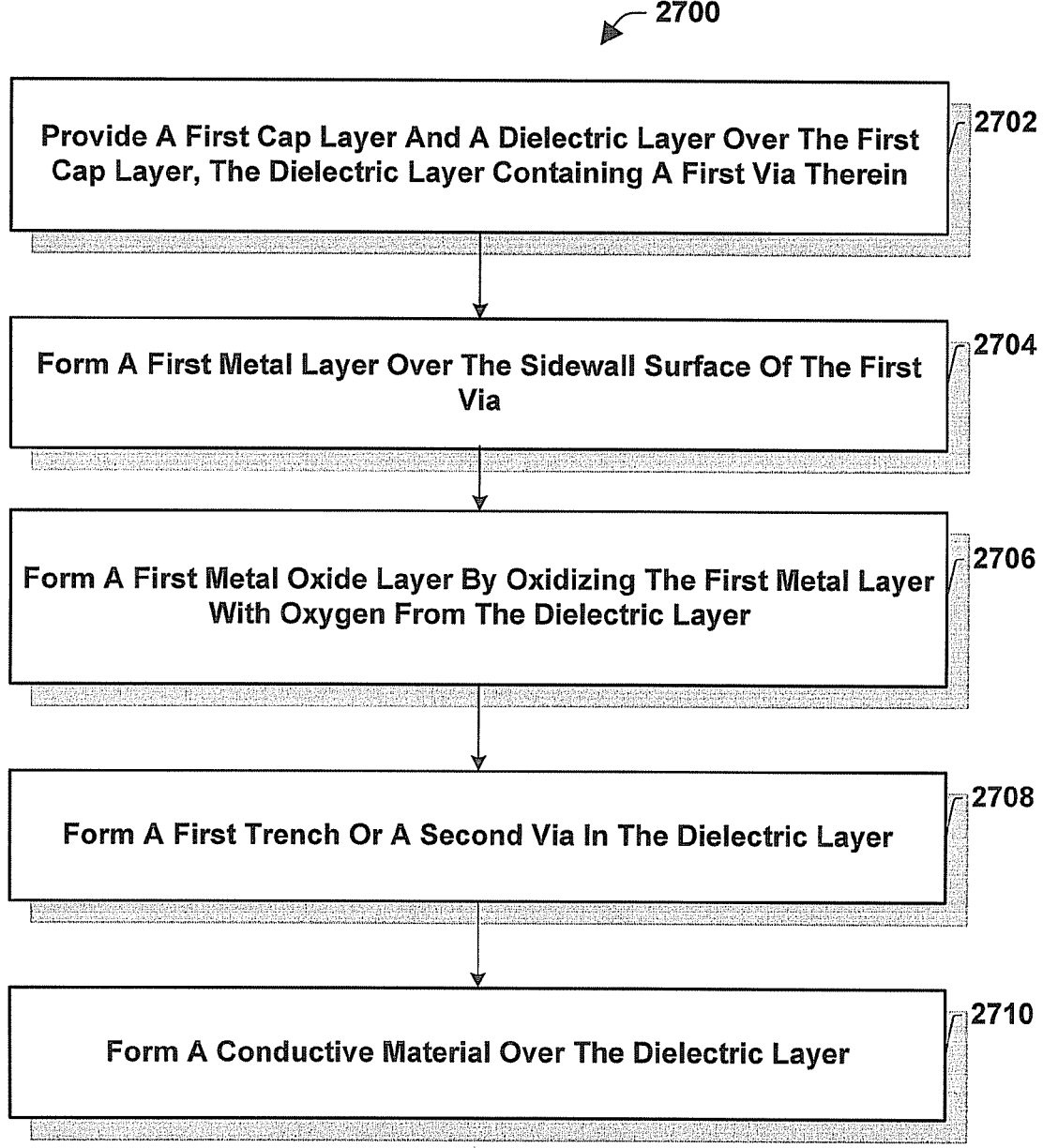
FIG. 27 is a flow diagram of an exemplary methodology of forming an interconnect structure in accordance with an aspect of the subject innovation.

FIG. 27 illustrates an exemplary methodology 2700 of making an interconnect structure. At 2702, a first cap layer and a dielectric layer over the first cap layer are provided. The dielectric layer contains a first via therein. At 2704, a first metal layer is formed over the sidewall surface of the first via. At 2706, a first metal oxide layer is formed by oxidizing the first metal layer with oxygen from the dielectric layer. At 2708, a first trench or a second via is formed in the dielectric layer. At 2710, a conductive material is formed over the dielectric layer.

Although not shown in FIG. 27, the methodology can involve one or more of the following features. The dialectic layer contains a first dielectric layer and a second dielectric layer over the first dielectric layer, the first dielectric layer having a lower dielectric constant than the second dielectric layer. The first dielectric layer contains porous SiCOH. The methodology further involves, after forming the first metal oxide layer, removing unoxidized metal of the first metal oxide layer. Substantially all the portions of the first metal oxide layer are removed when forming the first trench or the second via. Portions of the first metal oxide layer are remained after forming the first trench or the second via. The methodology further involves, after forming the first trench or the second via, a second metal oxide layer is formed over at least the sidewall surface and bottom surface of the first trench or the second via.

Figure 28:
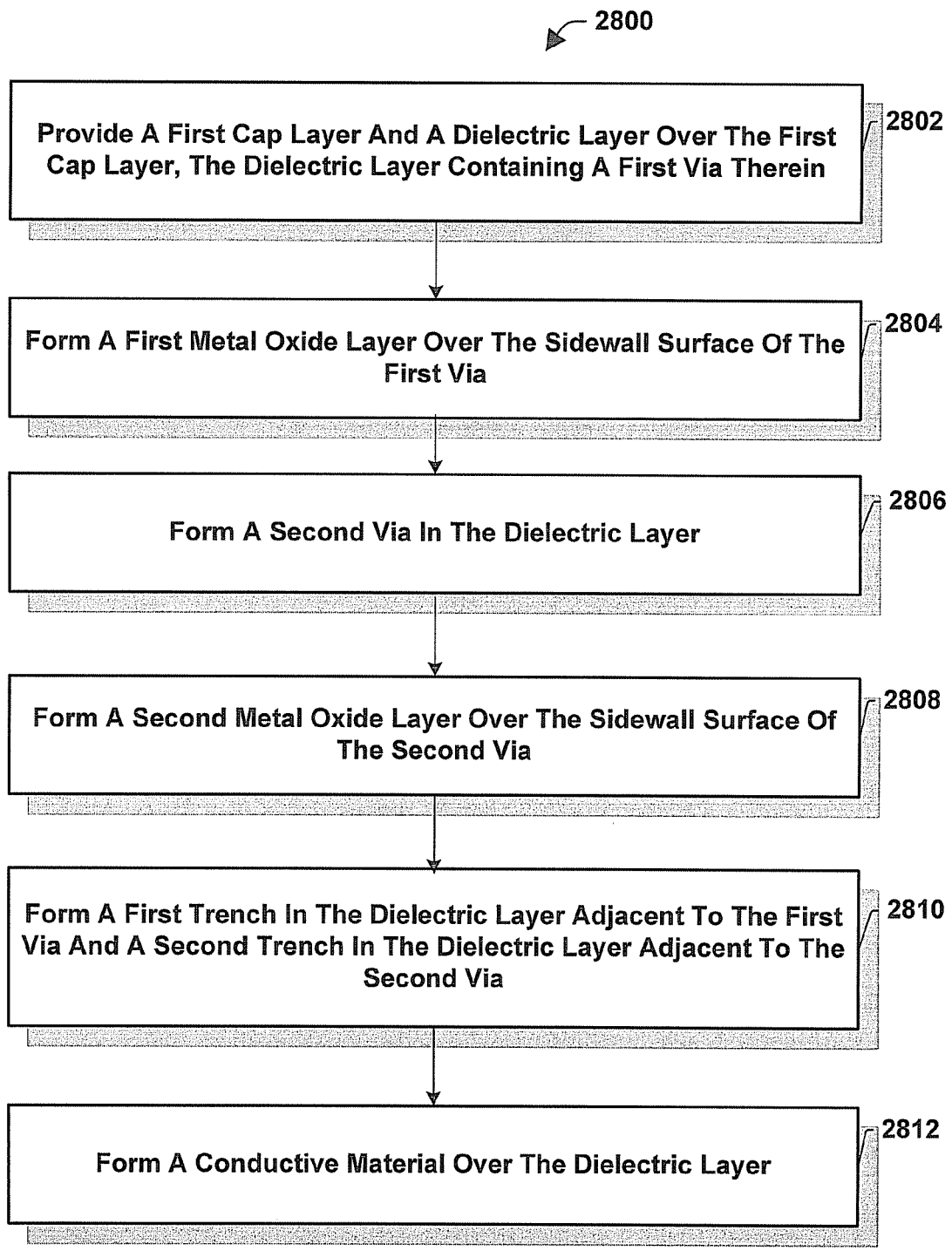
FIG. 28 is a flow diagram of another exemplary methodology of forming an interconnect structure in accordance with an aspect of the subject innovation.

FIG. 28 illustrates another exemplary methodology 2800 of making an interconnect structure. At 2802, a first cap layer and a dielectric layer over the first cap layer are provided. The dielectric layer contains a first via therein. At 2804, a first metal oxide layer is formed over the sidewall surface of the first via. At 2806, a second via is formed in the dielectric layer. At 2808, a second metal oxide layer is formed over the sidewall surface of the second via. At 2810, a first trench is formed in the dielectric layer adjacent to the first via and a second trench is formed in the dielectric layer adjacent to the second via. At 2812, a conductive material is formed over the dielectric layer.

Although not shown in FIG. 28, the methodology can involve one or more of the following features. The dialectic layer contains a first dielectric layer and a second dielectric layer over the first dielectric layer, the first dielectric layer having a lower dielectric constant than the second dielectric layer. Forming the first metal oxide layer involves forming a first metal layer over the sidewall surface of the first via; oxidizing the metal of the first metal layer with oxygen from the dielectric layer to form the first metal oxide layer; and removing unoxidized metal of the first metal oxide layer. Forming the second metal oxide involves forming a second metal layer over the sidewall surface of the second via; oxidizing the metal of the second metal layer with oxygen from the dielectric layer to form the second metal oxide layer; and removing unoxidized metal of the second metal oxide layer. Substantially all the portions of the first and second metal oxide layers are removed when forming the first and second trenches. Portions of the first and second metal oxide layers are remained after forming the first and second trenches. The methodology further involves, after forming the first and second trenches, a third metal oxide layer is formed over at least the sidewall surfaces and bottom surfaces of the first and second trenches.

Figure 29:
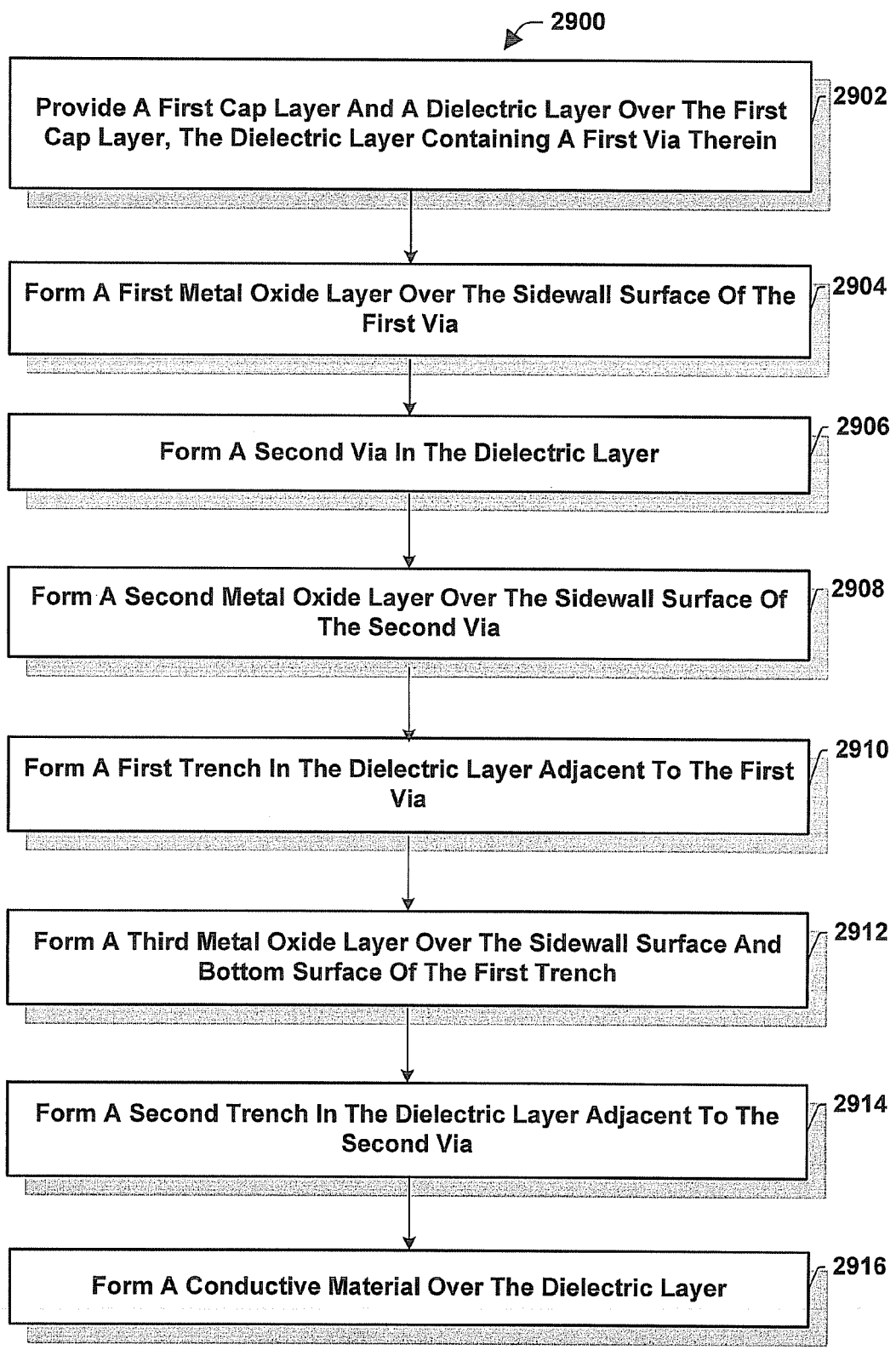
FIG. 29 is a flow diagram of yet another exemplary methodology of forming an interconnect structure in accordance with an aspect of the subject innovation.

FIG. 29 illustrates yet another exemplary methodology 2900 of making an interconnect structure. At 2902, a first cap layer and a dielectric layer over the first cap layer are provided. The dielectric layer contains a first via therein. At 2904, a first metal oxide layer is formed over the sidewall surface of the first via. At 2906, a second via is formed in the dielectric layer. At 2908, a second metal oxide layer is formed over the sidewall surface of the second via. At 2910, a first trench is formed in the dielectric layer adjacent to the first via. At 2912, a third metal oxide layer is formed over the sidewall surface and bottom surface of the first trench. At 2914, a second trench is formed in the dielectric layer adjacent to the second via. At 2916, a conductive material is formed over the dielectric layer.

Although not shown in FIG. 29, the methodology can involve one or more of the following features. The dialectic layer contains a first dielectric layer and a second dielectric layer over the first dielectric layer, the first dielectric layer having a lower dielectric constant than the second dielectric layer. The first dielectric layer contains porous SiCOH. Forming the first, second, and/or third metal oxide layer involves forming a metal layer over the sidewall surface of a via or trench; oxidizing metal of the metal layer with oxygen from the dielectric layer to form the metal oxide layer; and removing unoxidized metal of the metal oxide layer. The methodology further involves, after forming the second trench, a fourth metal oxide layer is formed over at least the sidewall surface and bottom surface of the second trench. The methodology further involves, after forming the second trench, a barrier layer is formed over the inner surfaces of the first and second vias and first and second trenches.

With respect to any figure or numerical range for a given characteristic, a figure or a parameter from one range may be combined with another figure or a parameter from a different range for the same characteristic to generate a numerical range.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

What is claimed is:

1. A method of making an interconnect structure, comprising:
   providing a first cap layer and a dielectric layer over the first cap layer, the dielectric layer comprising a first via therein;
   forming a first metal layer over the sidewall surface of the first via;
   forming a first metal oxide layer by oxidizing the first metal layer with oxygen from the dielectric layer;
   forming a first trench on the first via in the dielectric layer by etching after forming the first metal oxide layer; and
   forming a conductive material over the dielectric layer.

2. The method of claim 1, wherein the dielectric layer comprises a first dielectric layer and a second dielectric layer over the first dielectric layer, the first dielectric layer having a dielectric constant lower than a dielectric constant of the second dielectric layer.

3. The method of claim 2, wherein the first dielectric layer comprises porous SiCOH.

4. The method of claim 1 further comprising, after forming the first metal oxide layer, removing unoxidized metal of the first metal oxide layer.

5. The method of claim 1, wherein substantially all the portions of the first metal oxide layer are removed at the same time and/or after forming the first trench.

6. The method of claim 1, wherein portions of the first metal oxide layer are remained after forming the first trench.

7. The method of claim 1 further comprising, after forming the first trench, a second metal oxide layer is formed over at least the sidewall surface and bottom surface of the first trench.

8. A method of making an interconnect structure, comprising:
   providing a first cap layer and a dielectric layer over the first cap layer, the dielectric layer comprising a first via therein;
   forming a first metal oxide layer over the sidewall surface of the first via;
   forming a second via in the dielectric layer;
   forming a second metal oxide layer over the sidewall surface of the second via;
   forming a first trench in the dielectric layer adjacent to the first via and a second trench in the dielectric layer adjacent to the second via; and
   forming a conductive material over the dielectric layer.

9. The method of claim 8, wherein the dialectic layer comprises a first dielectric layer and a second dielectric layer over the first dielectric layer, the first dielectric layer having a dielectric constant lower than a dielectric constant of the second dielectric layer.

10. The method of claim 8, wherein forming the first metal oxide layer comprises:
    forming a first metal layer over the sidewall surface of the first via;
    oxidizing the metal of the first metal layer with oxygen from the dielectric layer to form the first metal oxide layer; and
    removing unoxidized metal of the first metal oxide layer.

11. The method of claim 8, wherein forming the second metal oxide comprises:
    forming a second metal layer over the sidewall surface of the second via;
    oxidizing the metal of the second metal layer with oxygen from the dielectric layer to form the second metal oxide layer; and
    removing unoxidized metal of the second metal oxide layer.

12. The method of claim 8, wherein substantially all the portions of the first and second metal oxide layers are removed at the same time and/or after forming the first and second trenches.

13. The method of claim 8, wherein portions of the first and second metal oxide layers are remained after forming the first and second trenches.

14. The method of claim 8 further comprising, after forming the first and second trenches, a third metal oxide layer is formed over at least the sidewall surfaces and bottom surfaces of the first and second trenches.

15. A method of making an interconnect structure, comprising:
    providing a first cap layer and a dielectric layer over the first cap layer, the dielectric layer comprising a first via therein;
    forming a first metal oxide layer over the sidewall surface of the first via;
    forming a second via in the dielectric layer;
    forming a second metal oxide layer over the sidewall surface of the second via;
    forming a first trench in the dielectric layer adjacent to the first via;
    forming a third metal oxide layer over the sidewall surface and bottom surface of the first trench;
    forming a second trench in the dielectric layer adjacent to the second via; and
    forming a conductive material over the dielectric layer.

16. The method of claim 15, wherein the dialectic layer comprises a first dielectric layer and a second dielectric layer over the first dielectric layer, the first dielectric layer having a dielectric constant lower than a dielectric constant of the second dielectric layer.

17. The method of claim 16, wherein the first dielectric layer comprises porous SiCOH.

18. The method of claim 15, wherein forming the first, second, and/or third metal oxide layers comprises:
    forming a metal layer over the sidewall surface of a via or trench;
    oxidizing metal of the metal layer with oxygen from the dielectric layer to form the metal oxide layer; and
    removing unoxidized metal of the metal oxide layer.

19. The method of claim 15 further comprising, after forming the second trench, a fourth metal oxide layer is formed over at least the sidewall surface and bottom surface of the second trench.

20. The method of claim 15 further comprising, after forming the second trench, a barrier layer is formed over the inner surfaces of the first and second vias and first and second trenches.

21. A method of making an interconnect structure, comprising:
    providing a first cap layer and a dielectric layer over the first cap layer, the dielectric layer comprising a first via therein;
    forming a first metal layer over the sidewall surface of the first via;
    forming a first metal oxide layer by oxidizing the first metal layer with oxygen from the dielectric layer;
    forming a second via in the dielectric layer by etching after forming the first via and after forming the first metal oxide layer; and
    forming a conductive material over the dielectric layer.

22. The method of claim 21, wherein the dielectric layer comprises a first dielectric layer and a second dielectric layer over the first dielectric layer, the first dielectric layer having a dielectric constant lower than a dielectric constant of the second dielectric layer.

23. The method of claim 22, wherein the first dielectric layer comprises porous SiCOH.

24. The method of claim 21 further comprising, after forming the first metal oxide layer, removing unoxidized metal of the first metal oxide layer.

25. The method of claim 21, wherein substantially all the portions of the first metal oxide layer are removed at the same time and/or after forming the second via.

26. The method of claim 21, wherein portions of the first metal oxide layer are remained after forming the second via.

27. The method of claim 21 further comprising, after forming the second via, a second metal oxide layer is formed over at least the sidewall surface and bottom surface of the second via.

* * * * *